United States Patent
Kim et al.

(10) Patent No.: US 11,127,852 B2
(45) Date of Patent: Sep. 21, 2021

(54) VERTICAL TRENCH GATE MOSFET WITH DEEP WELL REGION FOR JUNCTION TERMINATION

(71) Applicant: Texas Instruments Incorporated, Dallas, TX (US)

(72) Inventors: Sunglyong Kim, Allen, TX (US); Seetharaman Sridhar, Richardson, TX (US); Hong Yang, Richardson, TX (US); Ya Ping Chen, Chengdu (CN); Yunlong Liu, Chengdu (CN); Fei Ma, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/233,643

(22) Filed: Dec. 27, 2018

(65) Prior Publication Data

US 2020/0212218 A1  Jul. 2, 2020

(51) Int. Cl.
*H01L 29/78* (2006.01)
*H01L 29/423* (2006.01)
(Continued)

(52) U.S. Cl.
CPC ........ *H01L 29/7813* (2013.01); *H01L 21/225* (2013.01); *H01L 21/823828* (2013.01);
(Continued)

(58) Field of Classification Search
CPC ............... H01L 29/7813; H01L 29/404; H01L 29/0623; H01L 29/407; H01L 21/823828;
(Continued)

(56) References Cited

U.S. PATENT DOCUMENTS 7,612,407 B2 *  11/2009  Hshieh ................. H01L 29/407
                                                               257/330
7,671,408 B2 *  3/2010  Denison ................ H01L 29/407
                                                               257/330
(Continued)

OTHER PUBLICATIONS

Nastasi, et al., Ion Implantation and Synthesis of Materials, Springer Science and Business Media, 2007, ISBN 9783540452980, p. 202.

*Primary Examiner* — Vu A Vu
(74) *Attorney, Agent, or Firm* — Andrew R. Ralston; Charles A. Brill; Frank D. Cimino

(57) ABSTRACT

A trench gate metal oxide semiconductor field effect transistor (MOSFET) device includes an epitaxial layer on a substrate both doped a first conductivity type. Active area trenches have polysilicon gates over a double shield field plate. A junction termination trench includes a single shield field plate in a junction termination area which encloses the active area that includes a retrograde dopant profile of the second conductivity type into the epitaxial layer in the junction termination area. Pbody regions of a second conductivity type are between active trenches and between the outermost active trench and the junction termination trench. Source regions of the first conductivity type are in the body regions between adjacent active trenches. Metal contacts are over contact apertures that extend through a pre-metal dielectric layer reaching the body region under the source region, the single shield field plate, and that couples together the polysilicon gates.

32 Claims, 20 Drawing Sheets

(51) Int. Cl.
*H01L 29/40* (2006.01)
*H01L 21/225* (2006.01)
*H01L 29/10* (2006.01)
*H01L 29/06* (2006.01)
*H01L 29/66* (2006.01)
*H01L 21/8238* (2006.01)
*H01L 29/08* (2006.01)

(52) U.S. Cl.
CPC ...... *H01L 29/0623* (2013.01); *H01L 29/0865* (2013.01); *H01L 29/1095* (2013.01); *H01L 29/404* (2013.01); *H01L 29/407* (2013.01); *H01L 29/4236* (2013.01); *H01L 29/66734* (2013.01); *H01L 29/7811* (2013.01)

(58) Field of Classification Search
CPC ........... H01L 29/66734; H01L 29/0865; H01L 29/1095; H01L 29/4236; H01L 29/7811; H01L 21/225
USPC ....................................................... 257/329
See application file for complete search history.

(56) References Cited

U.S. PATENT DOCUMENTS

| | | | |
|---|---|---|---|
| 8,203,180 B2 * | 6/2012 | Darwish | H01L 29/7811 257/330 |
| 9,099,320 B2 * | 8/2015 | Hsieh | H01L 29/0619 |
| 9,105,494 B2 | 8/2015 | Lee et al. | |
| 2012/0037954 A1 * | 2/2012 | Hshieh | H01L 29/0638 257/139 |

* cited by examiner

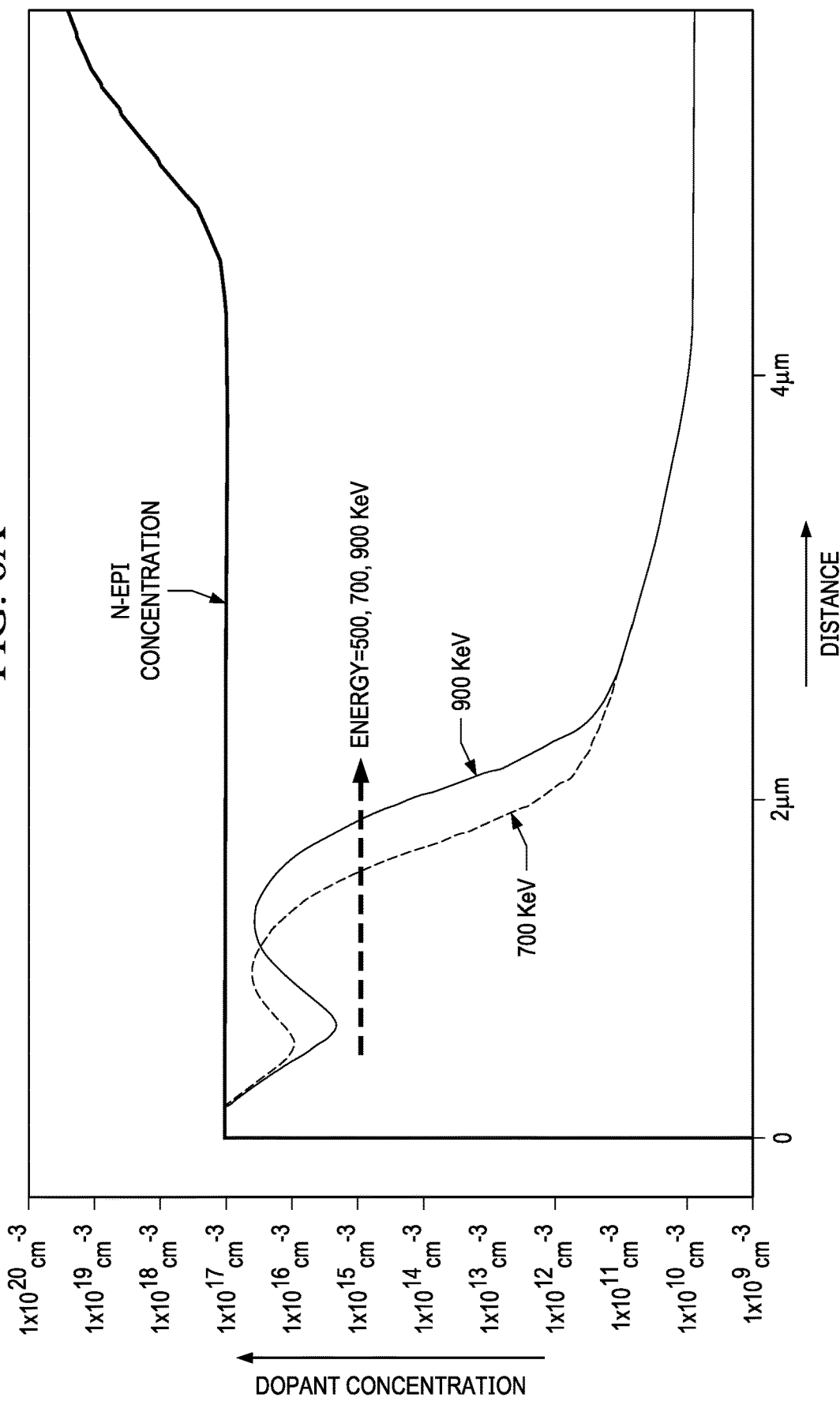

ns of the device, such as at the edges of the device that may be susceptible to failure because of the steep voltage gradient there. At the edge of the device the electric field generally needs to be reduced from the source potential to the drain potential in a smooth manner. What may be termed a junction termination trench (or termination trench) includes a dielectric lined polysilicon-filled trench that may be included on the die which surrounds the active region of the device having the active trench gates. A topside contact to the termination trench allows a connector (e.g., a metal connector) to be used to connect the polysilicon in the termination trench to the source and body of the active trenches so that during device operation the termination trench is biased, which can reduce susceptibility to device failures near the edges of the device due to the voltage gradient.

VERTICAL TRENCH GATE MOSFET WITH DEEP WELL REGION FOR JUNCTION TERMINATION

FIELD

This Disclosure relates to the field of semiconductor devices, and more particularly, but not exclusively, to vertical trench gate metal oxide semiconductor field effect transistors (MOSFETs) that have junction termination trenches that surround the active area of the device.

BACKGROUND

One type of power MOSFET is a trench gate MOSFET which is designed to handle significant power and to provide a high power drive capability by vertically conducting current from a top surface to a bottom surface of the die. The trench gate MOSFET in its active region generally includes a large number of active trench gate MOSFET cells each including a trench formed in the die, with each trench having surrounding 'body' regions and source regions, and where the trenches are deep enough to cross through the opposite dopant type doped body regions below the top surface of the die. Each active trench gate cell has a gate stack buried in the trench comprising a gate electrode generally comprising polysilicon and a gate dielectric. The gate electrodes, when appropriately biased, control the current conduction in the body region in their vicinity by virtue of the field effect that enables the MOSFET cells to be turned on enabling current to flow between the source and the drain.

The low drain to source resistance in the on-state or simply the on-resistance ($R_{ON}$) of a trench gate MOSFET may avoid the need for heat sinks which enables the device to be in a surface mount package with easier assembly on a printed circuit board (PCB). The $R_{ON}$ is commonly quoted as a specific $R_{ON}$ (Ron,sp). The lowering of $R_{ON}$ is a major factor driving the demand for trench gate MOSFET devices.

Careful design of the active trench gate cells in a vertical trench gate MOSFET device may provide a desirable increase in its drain to source breakdown voltage (BV). However, the design of the active trench gate cells generally does not provide breakdown protection for localized portions of the device, such as at the edges of the device that may be susceptible to failure because of the steep voltage gradient there. At the edge of the device the electric field generally needs to be reduced from the source potential to the drain potential in a smooth manner. What may be termed a junction termination trench (or termination trench) includes a dielectric lined polysilicon-filled trench that may be included on the die which surrounds the active region of the device having the active trench gates. A topside contact to the termination trench allows a connector (e.g., a metal connector) to be used to connect the polysilicon in the termination trench to the source and body of the active trenches so that during device operation the termination trench is biased, which can reduce susceptibility to device failures near the edges of the device due to the voltage gradient.

SUMMARY

This Summary is provided to introduce a brief selection of disclosed concepts in a simplified form that are further described below in the Detailed Description including the drawings provided. This Summary is not intended to limit the claimed subject matter's scope.

This application discloses various methods and devices that may be beneficially applied to manufacturing integrated circuits (ICs) including power MOSFETs with improved operating parameters, e.g. a higher drain-to-source breakdown voltage, for large mesa width between trench gate structures. While such embodiments may be expected to provide improvements in reliability of such ICs, no particular result is a requirement of the described invention(s) unless explicitly recited in a particular claim.

Disclosed aspects include a trench gate MOSFET device that includes an epitaxial layer on a substrate both of a first conductivity type. Active area trenches have polysilicon gates over a double shield field plate. A junction termination trench includes a single shield field plate in a junction termination area which encloses the active area. The termination trench includes a retrograde dopant profile of a second conductivity type into the epitaxial layer in the junction termination area. Body regions of the second conductivity type are between the active trenches and between the outermost active trench and the junction termination trench. Source regions of the first conductivity type are in the body regions between adjacent active trenches. There is a metal contact over a contact aperture that extends through a pre-metal dielectric (PMD) layer reaching the body region under the source region and a contact aperture to the single shield field plate, and a metal contact over a contact aperture that couples together the polysilicon gates.

BRIEF DESCRIPTION OF THE DRAWINGS

Reference will now be made to the accompanying drawings, which are not necessarily drawn to scale, wherein:

FIG. 6A shows an example dopant profile with the dopant concentration as a function of distances showing simulation results for the final IC from a disclosed deep pwell implantation into an n epi layer showing several example implant energies.

DETAILED DESCRIPTION

Figure 1:
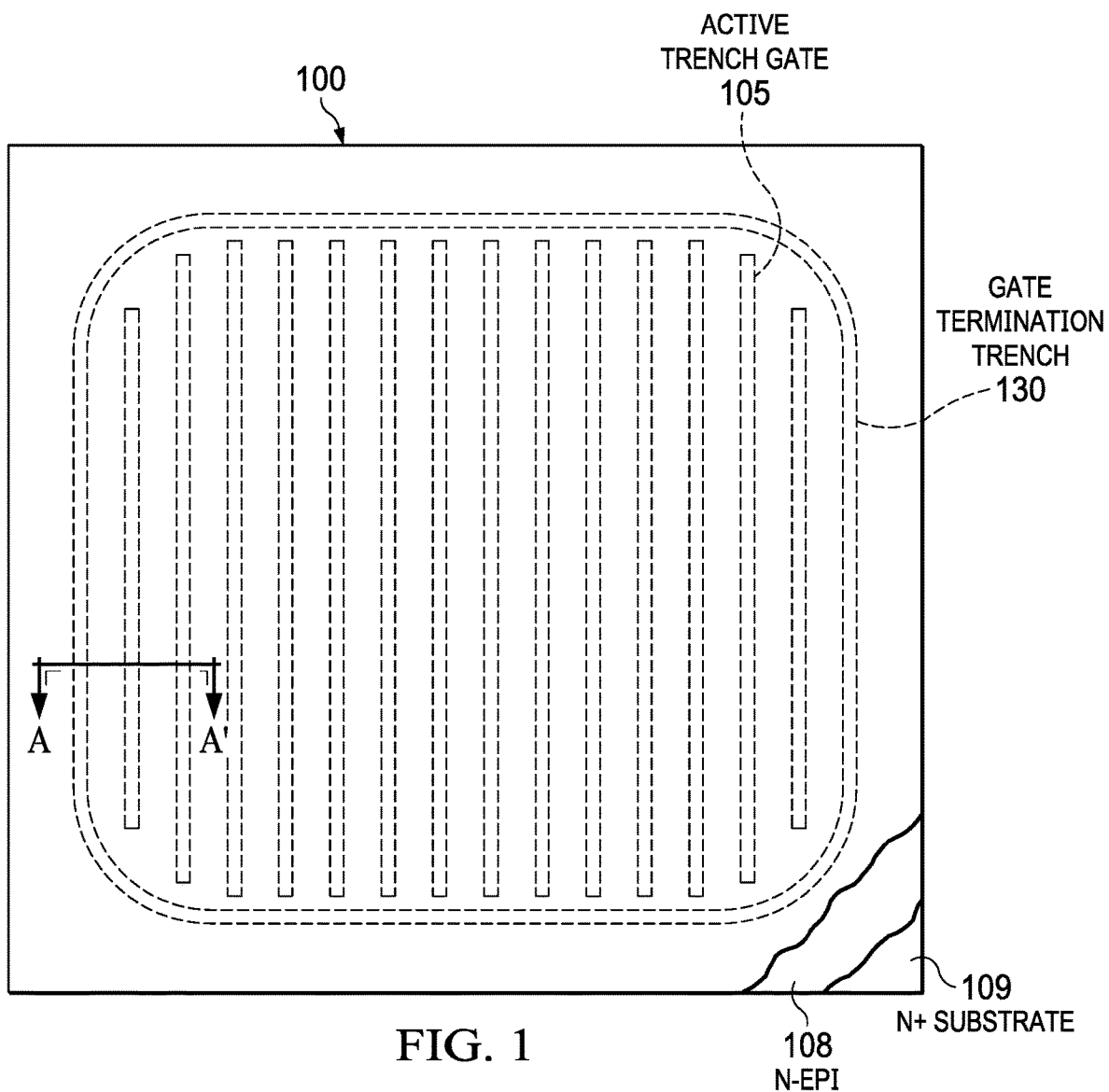
FIG. 1 depicts an a high level top view depiction of a disclosed vertical trench gate MOSFET device having active trench gate cells in an active region along with an outer junction termination trench that provides a junction termination region which surrounds the active region of the device, where the active trench gates are shown having a length dimension that are parallel to one another.

Example aspects in this disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

This Disclosure recognizes for vertical trench gate MOSFET devices having junction termination trenches surrounding the active trench gate cells in the active area, when the junction termination trench has an asymmetric double shield field plate structure, there can be a drain to source BV degradation caused by alignment variation associated with forming this double shield field plate. Although replacing the double shield field plate structure with a symmetric single shield field plate (meaning a single uniform cross sectional area plate/shield) provides for better process control of the junction termination trench including a simplified process flow, the drain to source BV for the vertical trench gate MOSFET device is significantly reduced due to a degradation in the charge balance effect.

Disclosed vertical trench gate MOSFET devices include a junction termination trench that includes a single shield. The fabrication process adds at least one additional deep implantation into the epitaxial layer around the termination trench for counter-doping the epitaxial layer with a retrograde dopant profile that reduces the net dopant concentration in the epitaxial layer, thereby reducing the majority carrier concentration in the implanted region. The reduced net dopant concentration in the epitaxial layer can thereby compensate for the degradation in the charge balance effect and thus at least reduce the device's drain to source BV due to the use of a symmetric termination trench. While various examples are presented in the context of an NMOS MOSFET device, the described principles may also be applied effectively to a PMOS MOSFET device.

FIG. 1 depicts a high level top view depiction of a disclosed vertical trench gate n-channel MOSFET device 100 with a deep pwell region in an n-epi layer 108 (see deep pwell region 131 in FIG. 2 described below). The deep pwell region has a retrograde dopant profile that counter-dopes the n-type doping concentration in the n-epi layer 108 in the junction termination area around the outer junction termination trench 130 which provides a junction termination region that surrounds the active region having the active trench gates 105. The active region has active trench gate MOSFET cells with their active trench gates 105 shown with their length direction being oriented parallel to one another. The trench gate MOSFET device 100 is shown formed on an n+ substrate 109 that provides an n+ drain having the n-epi layer 108 thereon. Although not shown, there may be a metal drain contact layer (e.g., Ti/Ni/Ag) on the bottom side of the n+ substrate 109.

The junction termination trench 130 provides the junction termination region that surrounds the active region for the device 100 which enables the device 100 to sustain a higher drain to source BV. The active area as described below has pbody regions 102 and source regions 103 within the pbody regions 102 to provide a MOSFET structure that enables turning on the active trench gate cells with a proper gate-to-body region bias to form a conduction channel that enables current to flow between the source regions 103 through the n-epi layer 108 as a drift region to the n+ substrate 109 (e.g., functioning as a drain). The cutline shown in FIG. 1 as A-A' is depicted in FIGS. 2 and 3 described below.

Figure 2:
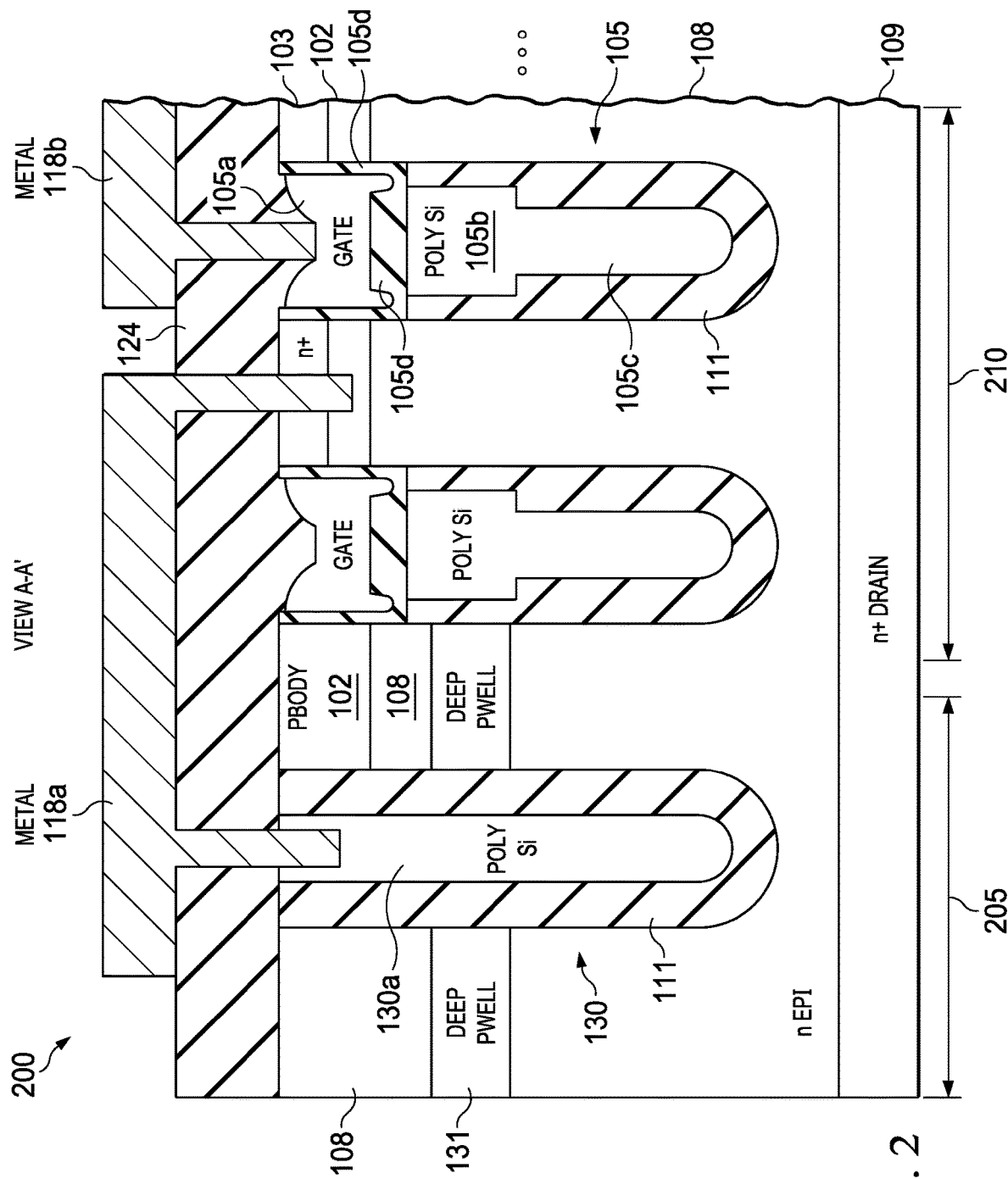
FIG. 2 is a cross sectional view along the cutline shown in FIG. 1 that shows an example vertical trench gate n-channel MOSFET device with a double shield field plate in the active region, a single shield field plate in the junction termination trench, and a deep pwell region in the n-type epitaxial (n-epi) layer that provides a retrograde dopant profile that counter-dopes the n-epi layer in the junction termination area and between the junction termination trench and the outermost active gate.
Figure 3:
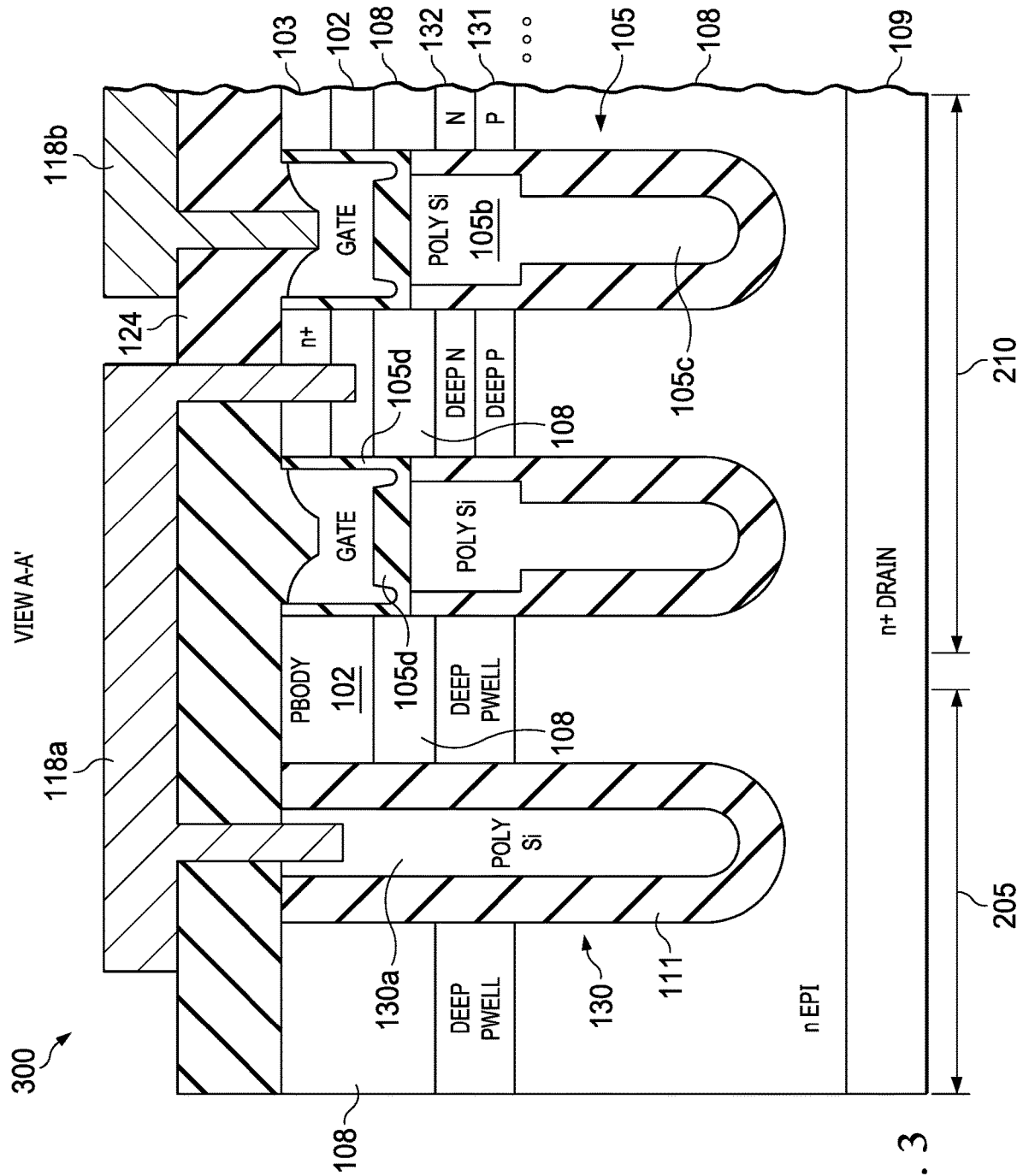
FIG. 3 is a cross sectional view again along the cutline shown in FIG. 1 that shows example vertical trench gate n-channel MOSFET device with a double shield field plate in the active region, a single shield field plate in the junction termination trench, and a blanket (unmasked) deep pwell implantation region in the n-epi layer that provides a retrograde dopant profile that counter-dopes the n-epi layer in the junction termination area and also the active area between active trench gates, and also shows an added deep nwell implantation for forming a deep nwell region at the surface of the deep pwell implantation region in the active region.

FIG. 2 is a cross sectional view along the cutline A-A' shown in FIG. 1 that shows an example vertical trench gate n-channel MOSFET device 200 with a junction termination area 205 and an active area 210, with a plurality of active trench gates 105 having a double shield field plate 105b, 105c in the active area 210, and a single shield field plate 130a in the junction termination trench 130 in the junction termination area 205. The double shield field plate 105b, 105c includes a wider upper polysilicon portion 105b and a narrower lower polysilicon portion 105c. In the case of doped polysilicon for the field plates, the polysilicon may be doped (e.g. n+ or p+), which can be doped in-situ during the polysilicon deposition, or deposited undoped and then ion implanted with one or more dopant ions. There is a deep pwell region 131, sometime referred to briefly as pwell 131 or deep pwell 131, in the n-epi layer 108 that provides a retrograde p-type dopant profile that counter-dopes the n-type doping in the n-epi layer 108 in the junction termination area 205 and in the region between the junction termination trench 130 and the outermost of the active trench gates 105. A peak concentration in the retrograde p-type dopant profile may be at least about 40% of an n-type p-type dopant concentration in the n-epi layer 108. As used herein throughout, "about" refers to ±5% of a nominal value.

While the deep pwell region 131 is referred to as a "well", the region in which the p-type dopant is placed remains n-type and the majority carriers are electrons. Thus the pwell 131 may be referred to sometimes as a "counter-doped buried layer". However, due to the p-type counter-doping, the majority carrier concentration is reduced with respect the remaining n-epi layer 108. The reduction of the electron concentration in the portion of the n-epi layer 108 near the single shield field plate 130a is expected to provide beneficial results as described herein, e.g. an increase of the drain-source BV.

There are source regions 103 shown as n+ for acting as a source for the active trench gate cells formed with the pbody regions 102. The active trench gates 105 each have a polysilicon gate 105a with a gate dielectric layer 105d having a horizontal portion below the polysilicon gate 105a and having a vertical portion between the sidewalls of the polysilicon gate 105a and the pbody region 102 and the source region 103. The double shield field plate 105b, 105c is shown below the gate dielectric layer 105d under the polysilicon gate 105a. The gate dielectric layer 105d when it comprises thermal silicon oxide may be thicker in the horizontal portion above the double shield field plate 105b, 105c (due to a higher thermal oxidation rate for polysilicon relative to single crystal silicon) as compared to its thickness on the vertical portion of the trench sidewall of the pbody region 102 and the source region 103, which results in the small dip shown in the thickness of the gate dielectric layer 105d in the trench corners of the active trench gates. The source region 103, n+ substrate 109 (e.g. providing a drain), with the source region 103 tied to the pbody region 102, operates as a three-terminal trench gate MOSFET cell. The polysilicon gates 105a are optionally shown having gate recesses that have a PMD layer 124 that also fills the gate recesses. Recessed gates may provide more process margin for the source contacts.

The dielectric in the trenches is generally shown as a trench dielectric layer 111. The trench dielectric layer 111 can comprise thermal silicon oxide with a deposited dielectric layer thereon that may comprise silicon oxide, or another dielectric material such as silicon nitride or silicon oxynitride, or a metal-containing high-k dielectric (e.g., k>5) material such as $HfO_2$. A metal 1 (M1) layer is over and fills contact apertures formed in the PMD layer 124 shown with a metal contact 118a connecting the single shield field plate 130a in the junction termination trench 130 to the source region 103 and pbody region 102 of the active trench gates 105, and a metal contact 118b connecting together the polysilicon gates 105a of the active trench gates 105.

FIG. 3 is a cross sectional view along the cutline A-A' shown in FIG. 1 that shows example vertical trench gate n-channel MOSFET device 300 with a double shield field plate 105b, 105c in the active area 210, and a single shield field plate 130a in the junction termination trench 130 in the junction termination area 205. A blanket (unmasked) deep pwell region shown as 131 is in the n-epi layer 108 that provides a retrograde p-type dopant profile that counter-dopes the n-epi layer 108 in the junction termination area 205 and also the active area 210 between active trench gates 105. There is also an added deep nwell 132 that has a retrograde n-type dopant profile at the surface of the deep pwell region 131 in the active area 210. As described further below, implementation of the deep pwell 131 and the deep nwell 132 may allow the use of a single mask to form the source regions 103 and the counter-doped buried region in the n-epi layer 108.

A process flow is now described. FIGS. 4A-4I show successive cross sectional views of an example in-process disclosed vertical trench gate n-channel MOSFET device with a double shield field plate for the active trench gates 105 in the active area 210, and a single shield field plate in the junction termination trench 130 in the junction termination area 205. A deep pwell region 131 in the n-epi layer 108 is that provides a retrograde dopant profile that counter-dopes the n-epi layer 108 in the junction termination area 205 between the junction termination trench 130 and the outermost of the active trench gates 105.

Figure 4A:
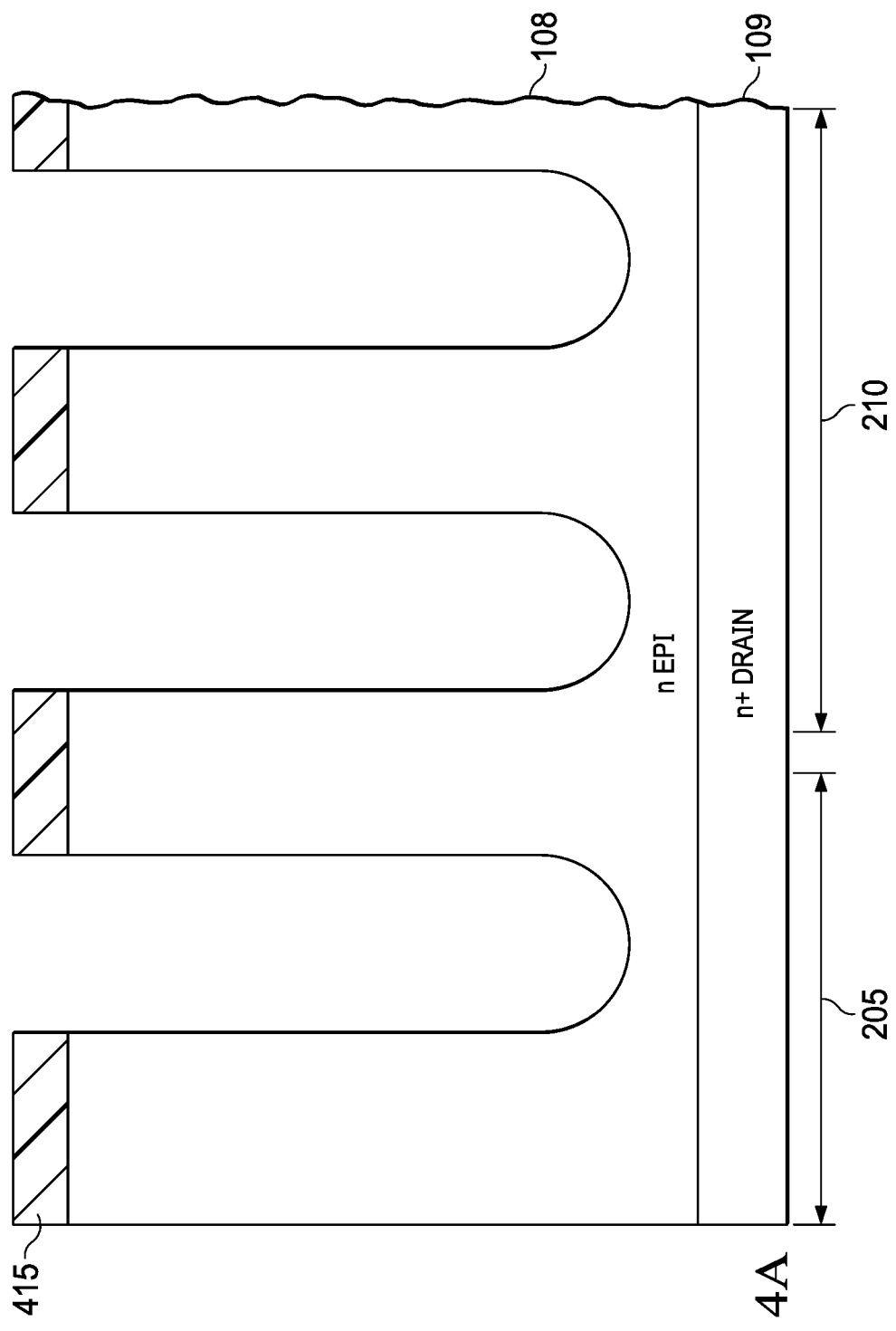
FIGS. 4A-4I show successive cross sectional views of an example in-process disclosed vertical trench gate n-channel MOSFET device with a double shield field plate in the active region, a single shield field plate in the junction termination trench, and a deep pwell region formed from a masked deep pwell implant into the n-epi layer that provides a retrograde dopant profile that counter-dopes the n-epi layer in the junction termination area and the area between the junction termination trench and the outermost active gate, corresponding to steps in an example method of forming the device.

FIG. 4A shows a cross sectional view of the in-process trench gate MOSFET device after silicon trench etching in the n-epi layer 108 such as by Reactive Ion Etching (RIE) to form the trench apertures shown. A patterned hard mask (HM) layer, shown as HM layer 415 such as comprising silicon nitride, may be used in this step. Although not shown, there may also be a thin silicon pad oxide layer under the HM layer 415. The HM layer 415 may be removed after forming the trench apertures.

Figure 4B:
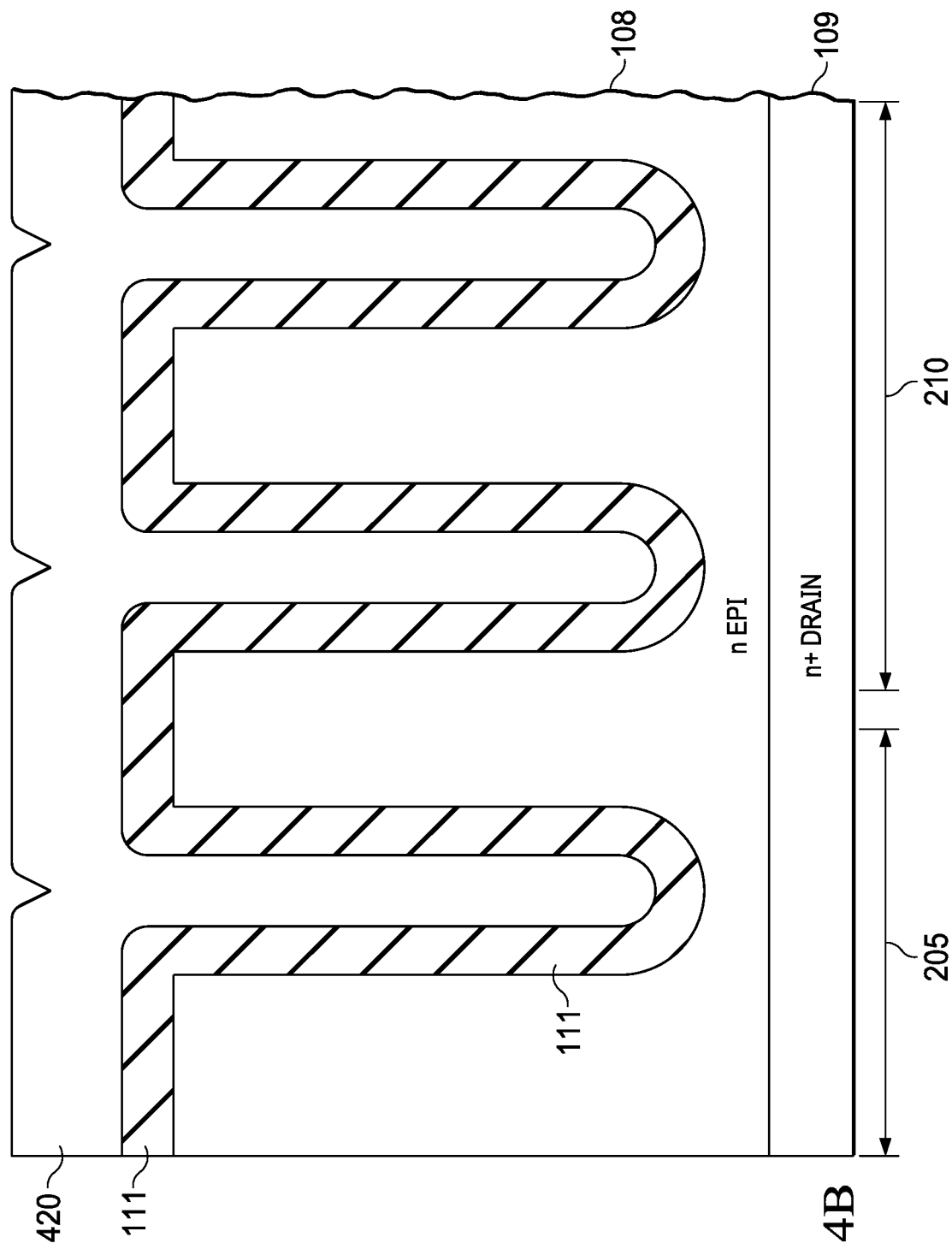

FIG. 4B shows a cross sectional view of the in-process trench gate MOSFET device after forming a trench dielectric layer 111, followed by a polysilicon deposition for forming a polysilicon layer 420 for polysilicon filling of junction termination trench 130 in the junction termination area 205 and the active trench gates 105 in the active area 210. The trench depth may be in a range between about 1 μm and about 10 μm. The trench dielectric layer 111 may be formed by growing a thermal oxide liner with a thickness in a range between about 50 nm and about 200 nm followed by a subatmospheric chemical vapor deposition (SACVD) of silicon oxide that may have a thickness in a range between about 100 nm and about 500 nm.

Figure 4C:
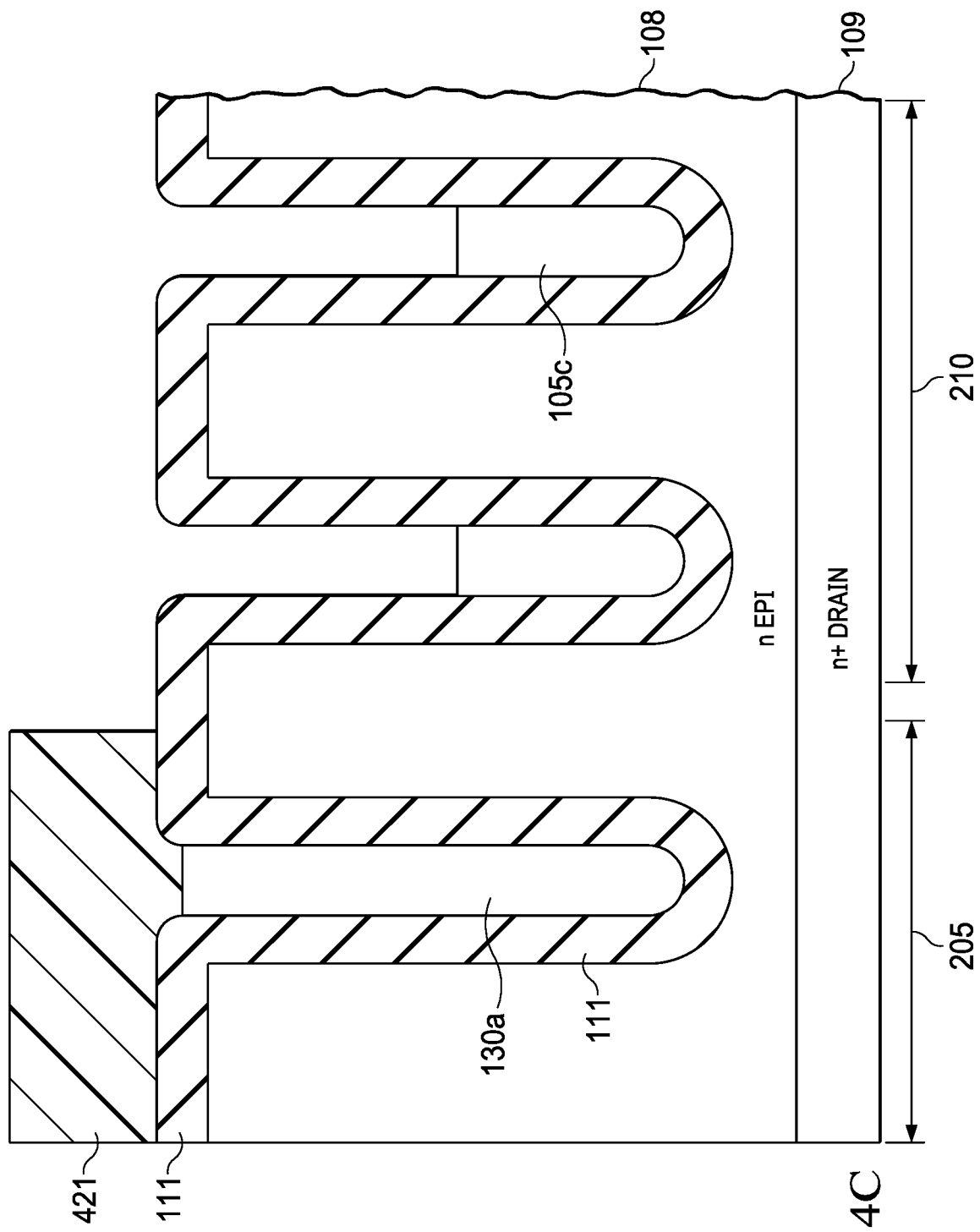
Figure 4D:
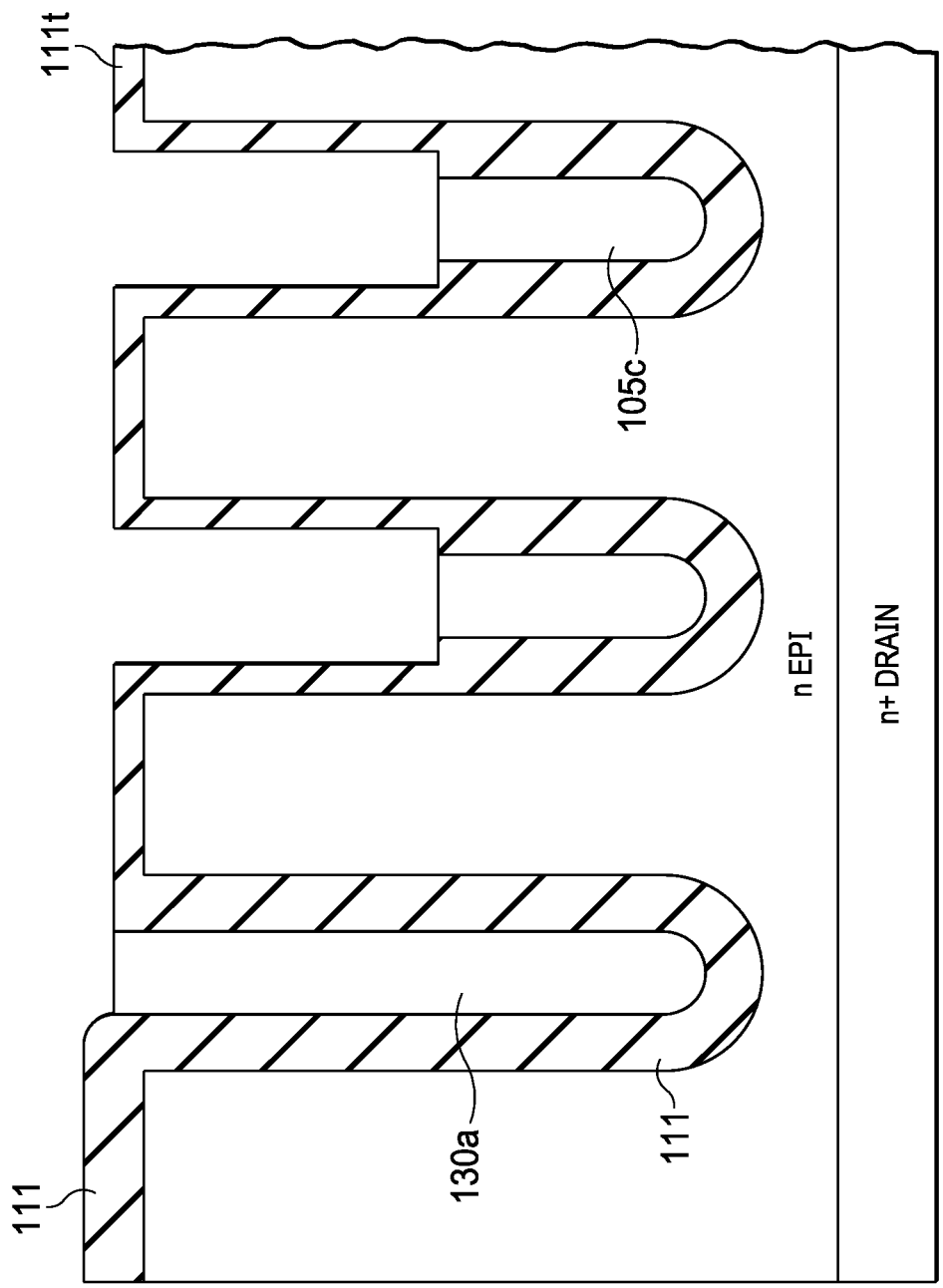

FIG. 4C shows a cross sectional view of the in-process trench gate MOSFET device after polysilicon chemical-mechanical polishing (CMP) to remove polysilicon layer overburden outside the trenches, then a polysilicon etch back process using masking pattern shown as 421 that only exposes the active area trenches in the active area 210, with the resulting polysilicon layer in the active area trenches now shown as 105c referred to herein as the lower polysilicon portion. FIG. 4D shows a cross sectional view of the in-process trench gate MOSFET device after oxide pullback of the trench dielectric layer 111 in the active area 210 to form a thinned trench dielectric layer now shown as 111t again using the masking pattern 421 as an etch mask, shown after removal of the masking pattern 421. The oxide pullback process may include a wet etch, e.g. HF.

Figure 4E:
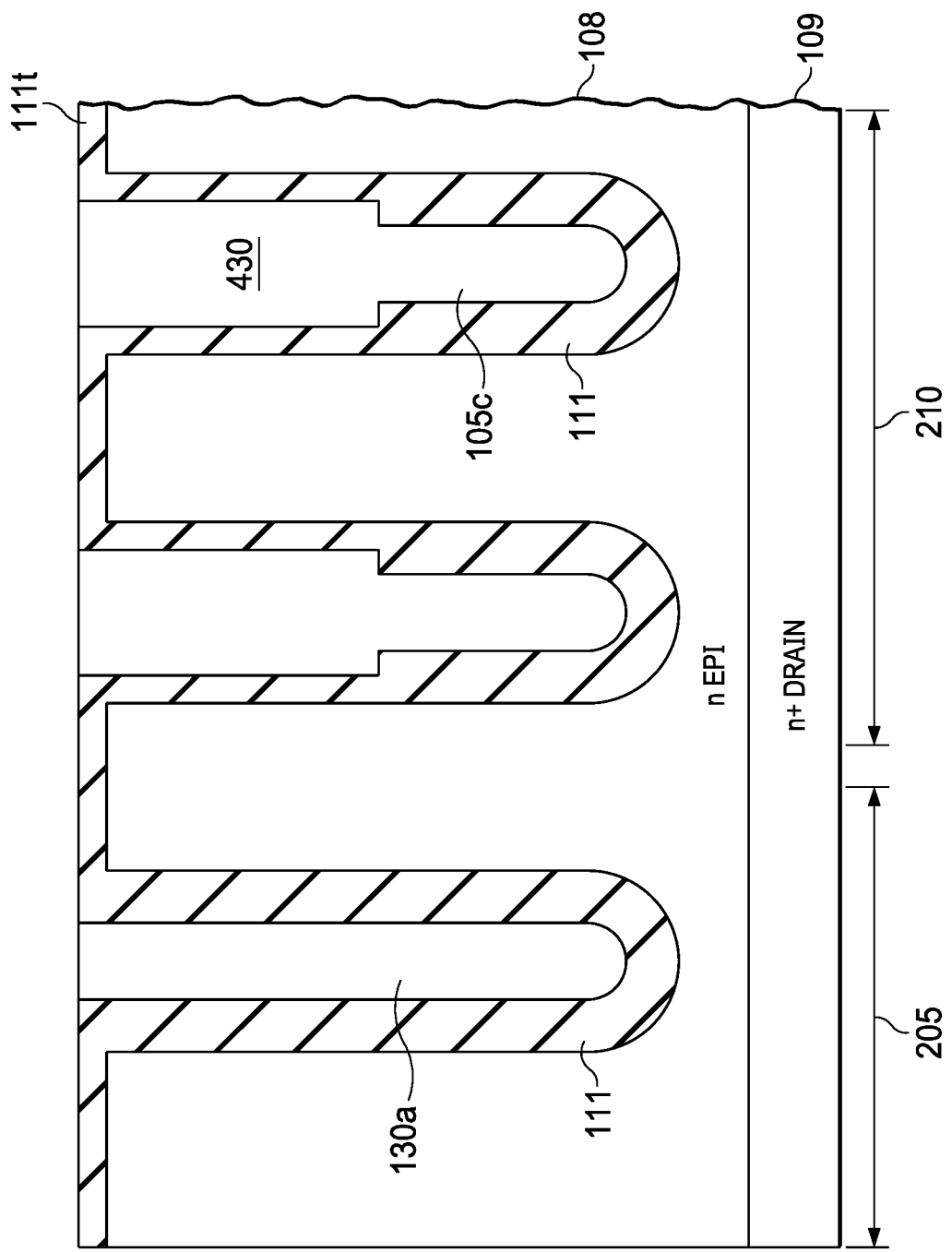
Figure 4F:
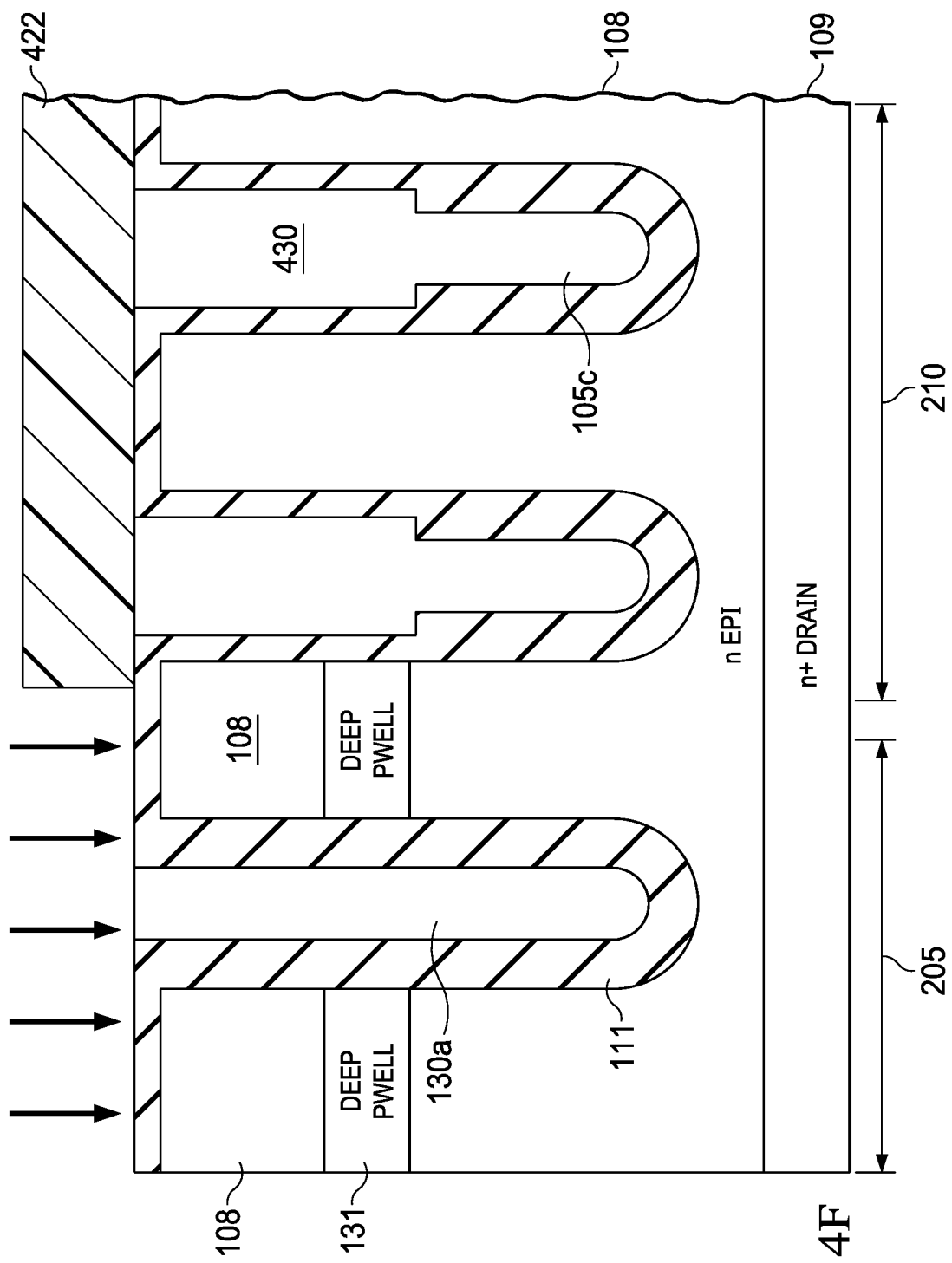

FIG. 4E shows the cross sectional view of the in-process trench gate MOSFET device after forming a second polysilicon layer 430 that includes filling of the active trench gates 105, followed by CMP. FIG. 4F shows the cross sectional view of the in-process trench gate MOSFET device during deep pwell implantation with a masking pattern 422 over the active area 210. The deep pwell region 131 is included at least between the outermost active trench and the junction termination trench. As shown, masking pattern 422 enables deep pwell implantation over the junction termination area 205 and the area between the junction termination trench and the outermost active trench gate. FIG. 4F also shows the deep pwell regions 131 formed by this implant which can provide a retrograde distribution of p-type dopant. The deep well implanting can comprise boron implantation with a dose in a range between about $8 \times 10^{11}$ cm$^{-2}$ and about $5 \times 10^{12}$ cm$^{-2}$ with an energy in a range between about 400 keV and about 1 MeV. Without implied limitation, in a more specific example boron may be implanted with a dose of about $2 \times 10^{12}$ cm$^{-2}$ and an energy of about 700 keV. The masking pattern 422 is then removed after this deep-pwell implant. The majority carrier type within the deep pwell region 131 remains n-type (electrons), but the carrier concentration is reduced relative to the n-epi layer 108 outside the deep pwell region 131.

Figure 4G:
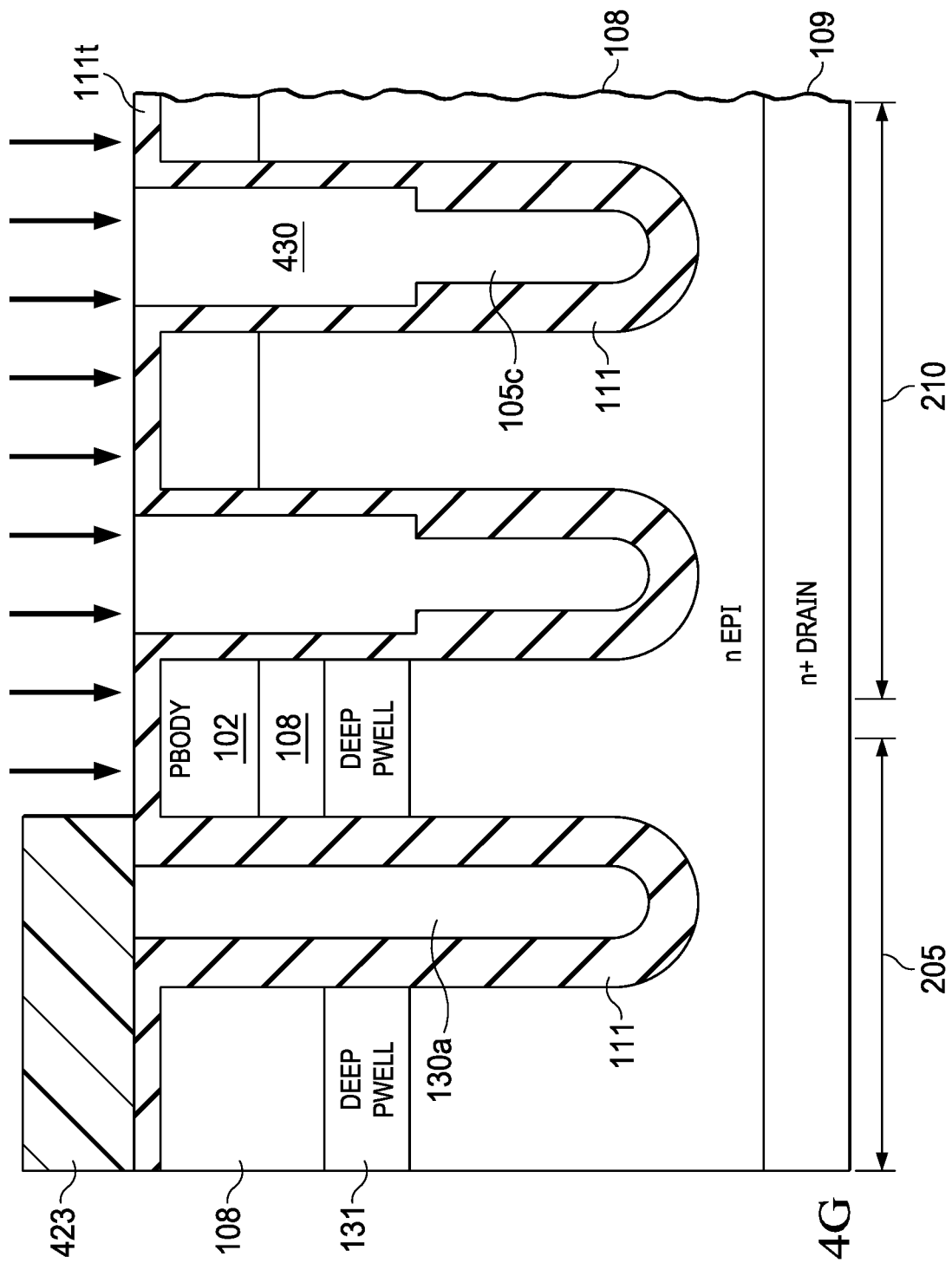

FIG. 4G shows the cross sectional view of the in-process trench gate MOSFET device after a masked pbody implant using a masking pattern 423 to protect the single shield field plate 130a. The pbody implant forms the pbody regions 102 shown including over the active area 210. These implant conditions may be conventional.

Figure 4H:
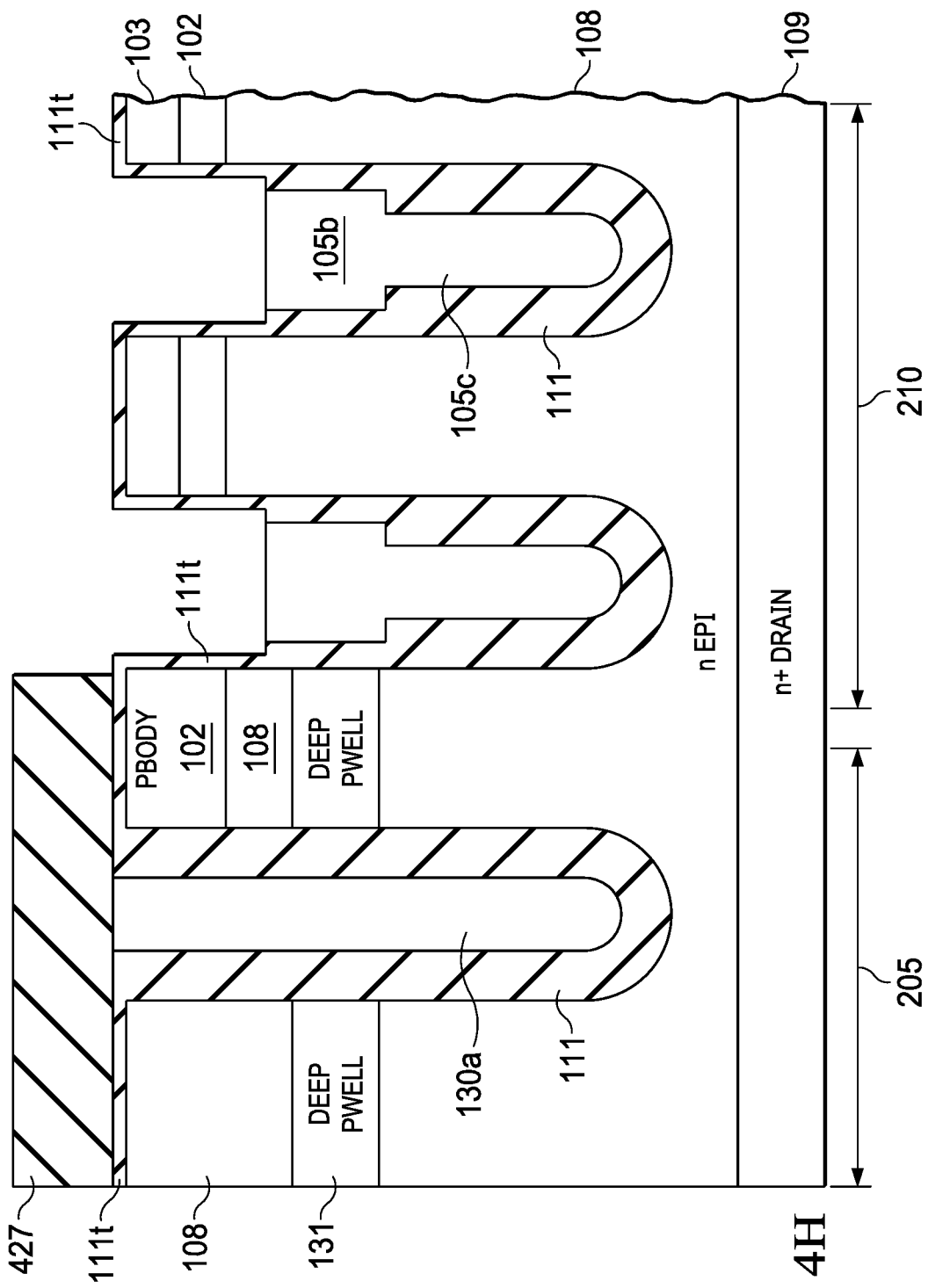

FIG. 4H shows the cross sectional view of the in-process trench gate MOSFET device after n-type ion implanting using a patterned deposited oxide layer 427 as an implant mask. The implanting forms the source regions 103 in the pbody regions 102. The patterned deposited oxide layer 427 is then used to mask an etch process that forms recesses in the second polysilicon layer 430, thus forming the upper polysilicon portion 105b of the active trench gate 105. The upper polysilicon portion 105b completes the double shield field plate 105b, 105c in the active region for the active trench gates 105. The thinned trench dielectric layer 111t is then removed in the active area 210, e.g. by wet etch.

Figure 4I:
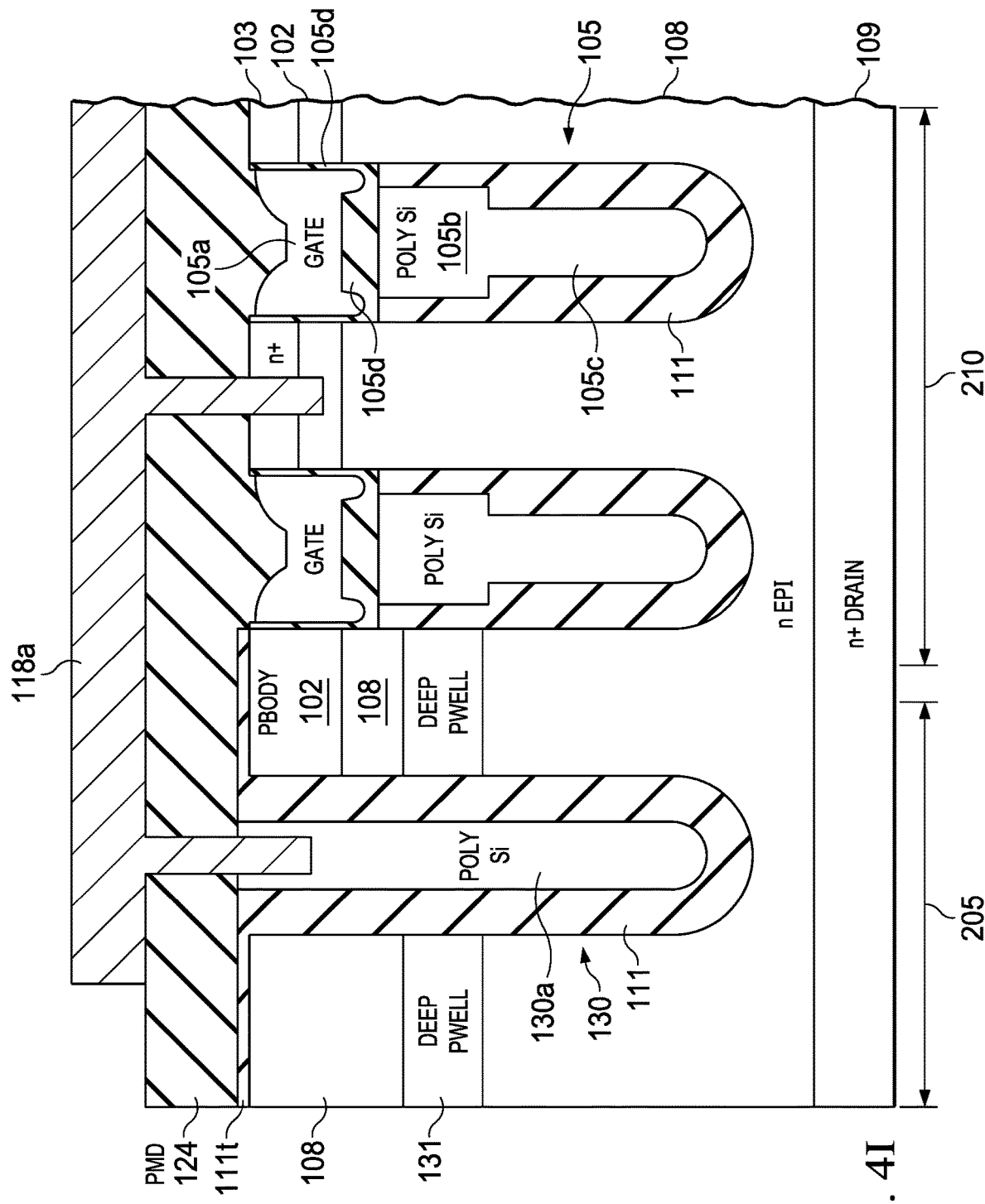

FIG. 4I shows the cross sectional view of the in-process trench gate MOSFET device after a thermal gate oxidation to form the gate dielectric layer 105d. The gate dielectric layer 105d over the silicon may have a thickness in a range between about 10 nm (e.g., for 5 V operation) and about 100 nm (e.g. for higher voltage operation).

Gate polysilicon deposition and patterning follows to form the polysilicon gates 105a shown with optional recesses formed in the polysilicon gates 105a, followed by the deposition of the PMD layer 124 which also fills the gate recesses. This is followed by contact aperture formation through the PMD layer 124 to expose the single shield field plate 130a, to expose the source region 103 and pbody region 102 shown recessed into the silicon, and to expose the polysilicon gates 105a. Metal 1 formation follows to provide metal contacts including metal contact 118a to the single shield field plate 130a, the source region 103 and pbody region 102, and another metal contact that is not shown in FIG. 4I which is described above as metal contact 118b that contacts the respective polysilicon gates 105a. The metal for the metal contacts can comprise aluminum, or another metal such as tungsten or cobalt. The junction termination trench 130 can be seen to have a single shield field plate 130a, and the active trench gates 105 to have a double shield field plate 105b, 105c.

FIGS. 5A-5E show successive cross sectional views of an example in-process disclosed vertical trench gate n-channel MOSFET device with a double shield field plate 105b, 105c in the active area 210, a single shield field plate 130a in the junction termination trench 130, and a deep pwell region 131 formed from a blanket deep pwell implant in the n-epi layer that adds a retrograde p-type dopant profile that counter-dopes the n-epi layer 108, starting from the in-process trench MOSFET device shown in FIG. 4E. This process flow further includes a deep nwell region 132 formed from a masked n-type implant for selectively doping the active area 210.

Figure 5A:
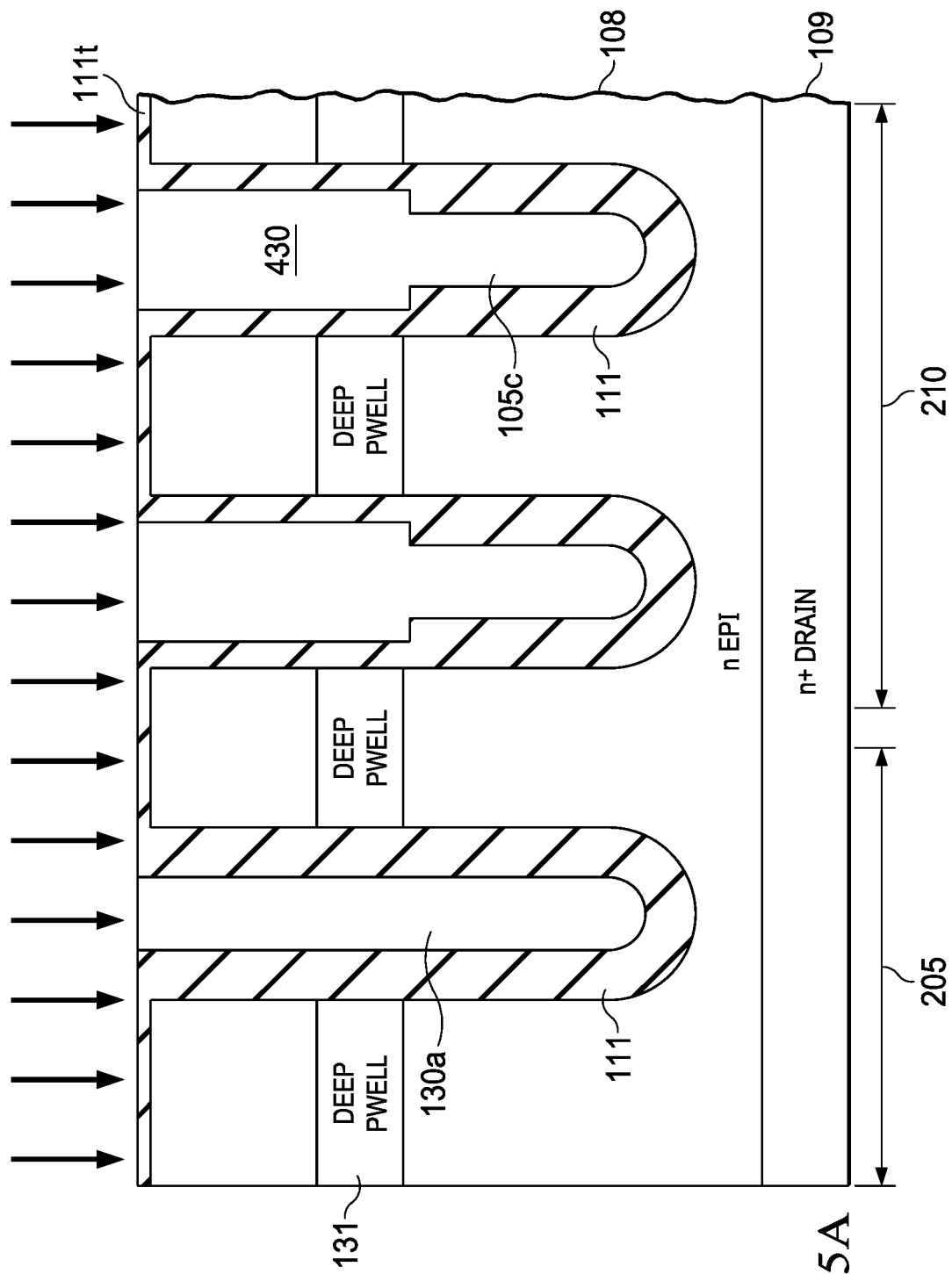
FIGS. 5A-5E show successive cross sectional views of an example in-process disclosed vertical trench gate n-channel MOSFET device with a double shield field plate in the active region, a single shield field plate in the junction termination trench, and a deep pwell region formed from a blanket deep pwell implant in the n-epi layer that provides a retrograde dopant profile that counter-dopes the n-epi layer, starting from the in-process trench MOSFET device shown in FIG. 4E, which further includes a deep nwell region formed from a masked n-type implant for selectively doping the active region, corresponding to steps in an example method of forming the device.
Figure 5B:
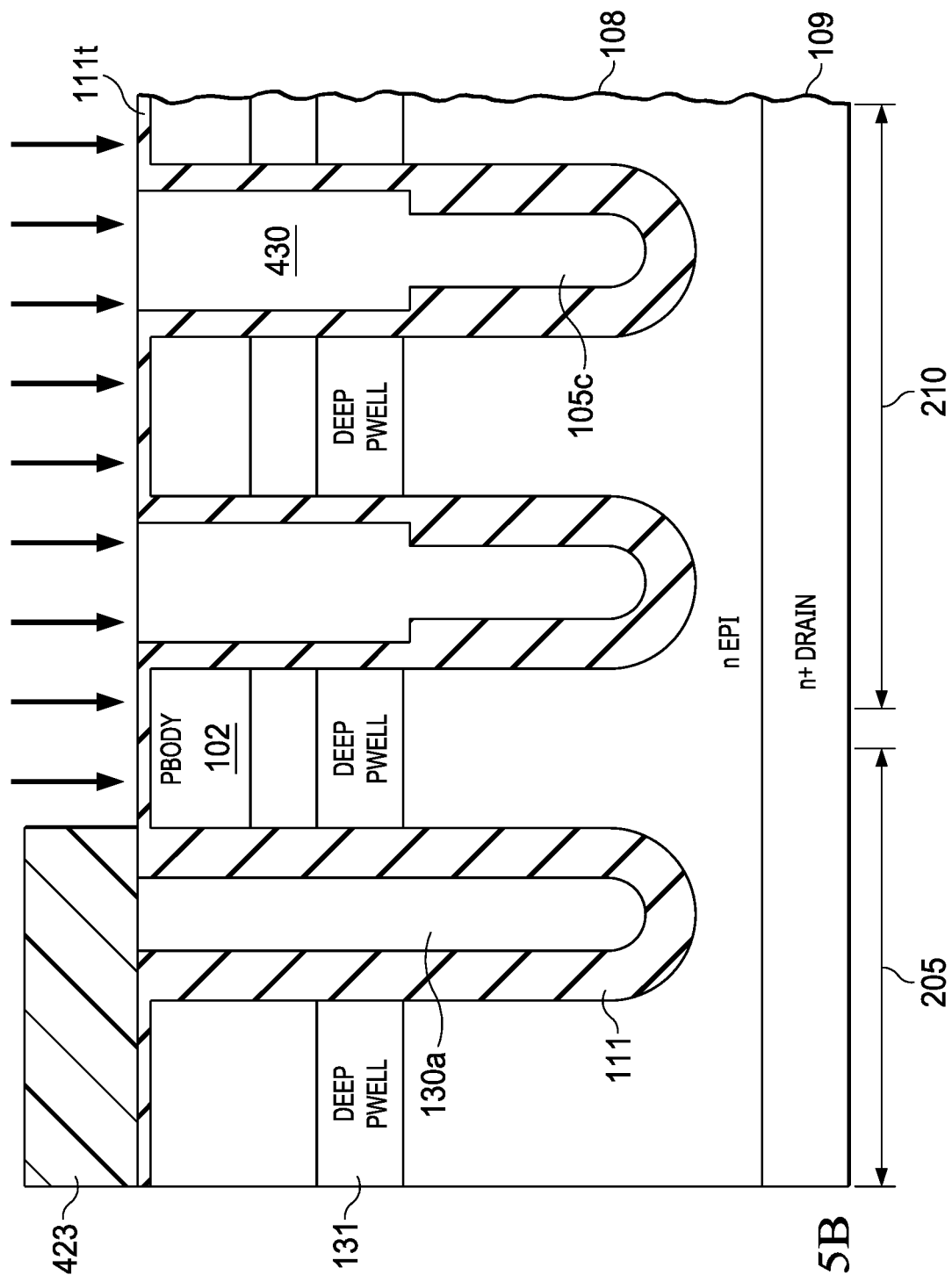
Figure 5C:
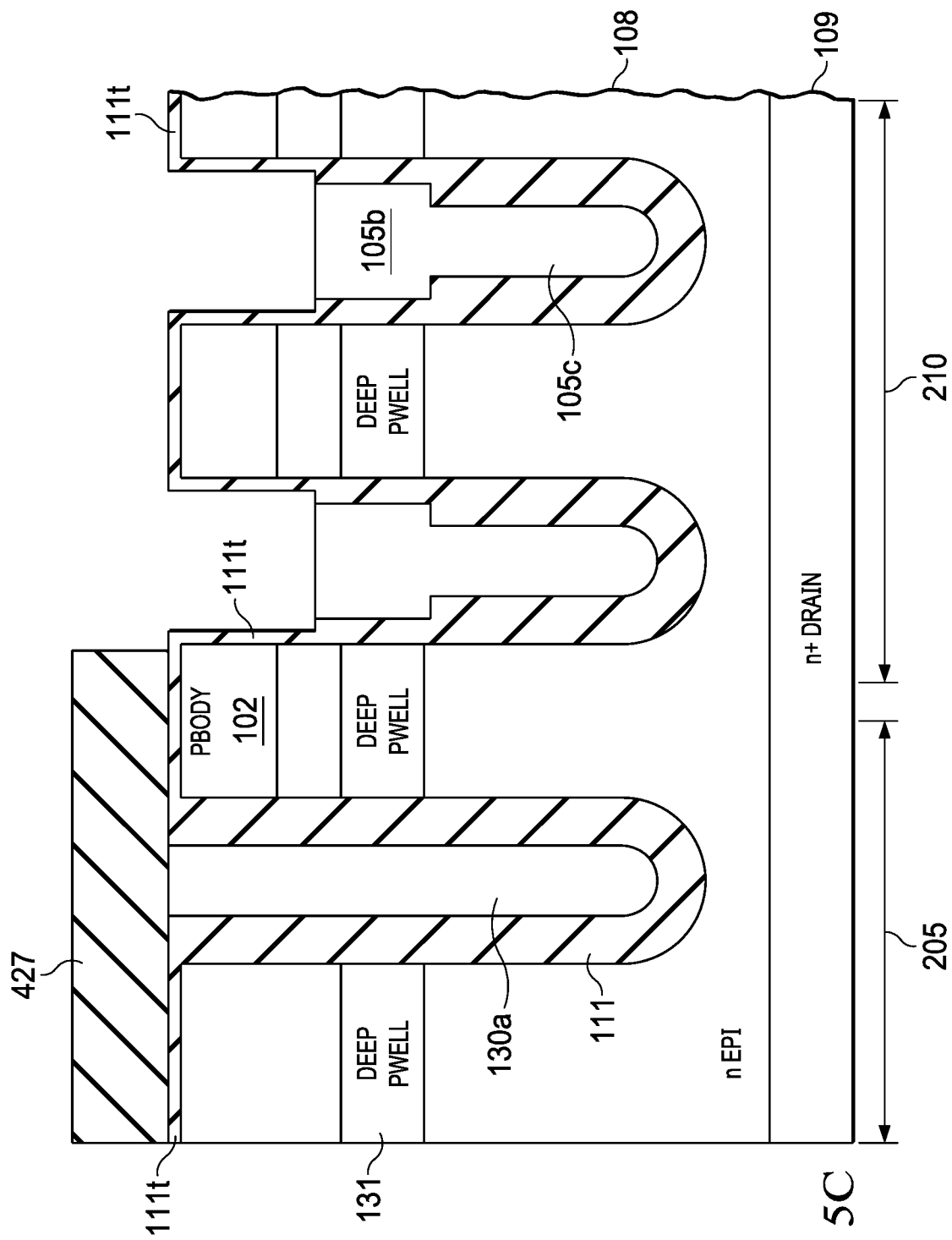
Figure 5D:
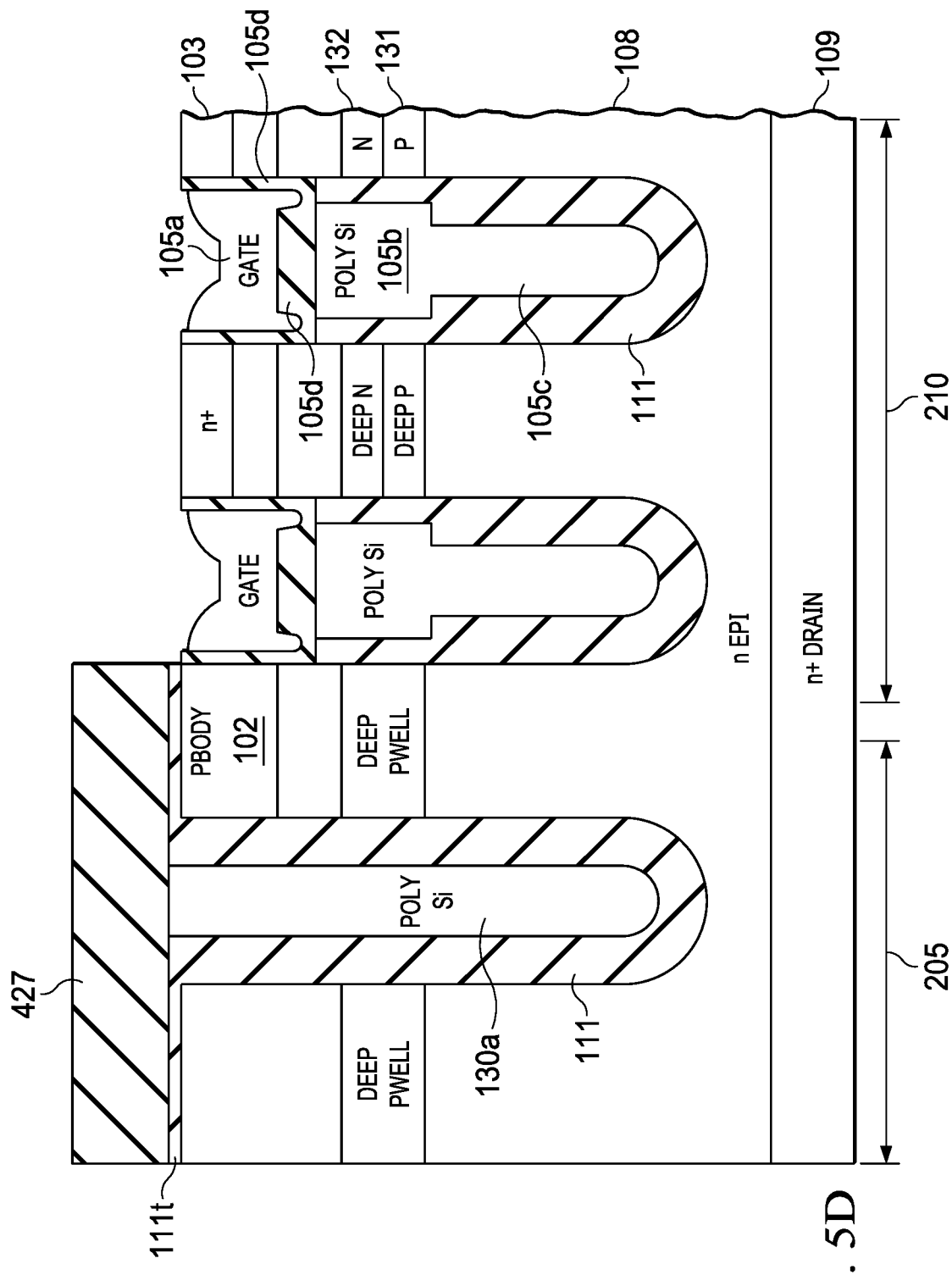

FIG. 5A shows the cross sectional view of the in-process trench gate MOSFET device after blanket implantation, e.g. boron, for forming the deep pwell regions 131. FIG. 5B shows the cross sectional view of the in-process trench gate MOSFET device after a masked pbody implant using masking pattern 423 shown to protect the outer junction termination trench 130. The implant forms the pbody regions 102 shown including over the active area 210. FIG. 5C shows the cross sectional view of the in-process trench gate MOSFET device after forming a patterned deposited oxide layer 427, and using the patterned deposited oxide layer 427 as an etch mask etching second polysilicon recesses in the active trenches to provide the polysilicon portion now shown as the upper polysilicon portion 105b that completes the double shield field plate 105b, 105c in the active region the active trench gates 105. FIG. 5D shows the cross sectional view of the in-process trench gate MOSFET device after using the masking pattern of the patterned deposited oxide layer 427 as an implant mask for forming source regions 103 and also a second implant for forming deep nwell regions 132.

While the deep nwell regions 132 are shown schematically as a layer distinct from the deep pwell regions 131, the deep pwell regions 131 may substantially overlap the nwell regions 132. In some examples, a counter-doped buried layer portion of the n-epi layer in the active area 210 includes both a p-type dopant and an n-type dopant that is in addition to the n-type dopant already present in the n-epi layer 108. Thus the counter-doped buried layer may have an n-type dopant concentration greater than the dopant concentration of the n-epi layer 108. In some cases the conductivity and/or the majority carrier concentration of the counter-doped buried layer and the n-epi layer 108 are about the same, e.g. within about 20%. Implant conditions for forming the deep nwell regions 132 can generally comprise any n-type dopant, such as phosphorous at a dose within a range between about $1 \times 10^{12}$ and about $1 \times 10^{13}$ cm$^{-2}$, and at an energy within a range between about 500 keV and about 3 MeV.

Figure 5E:
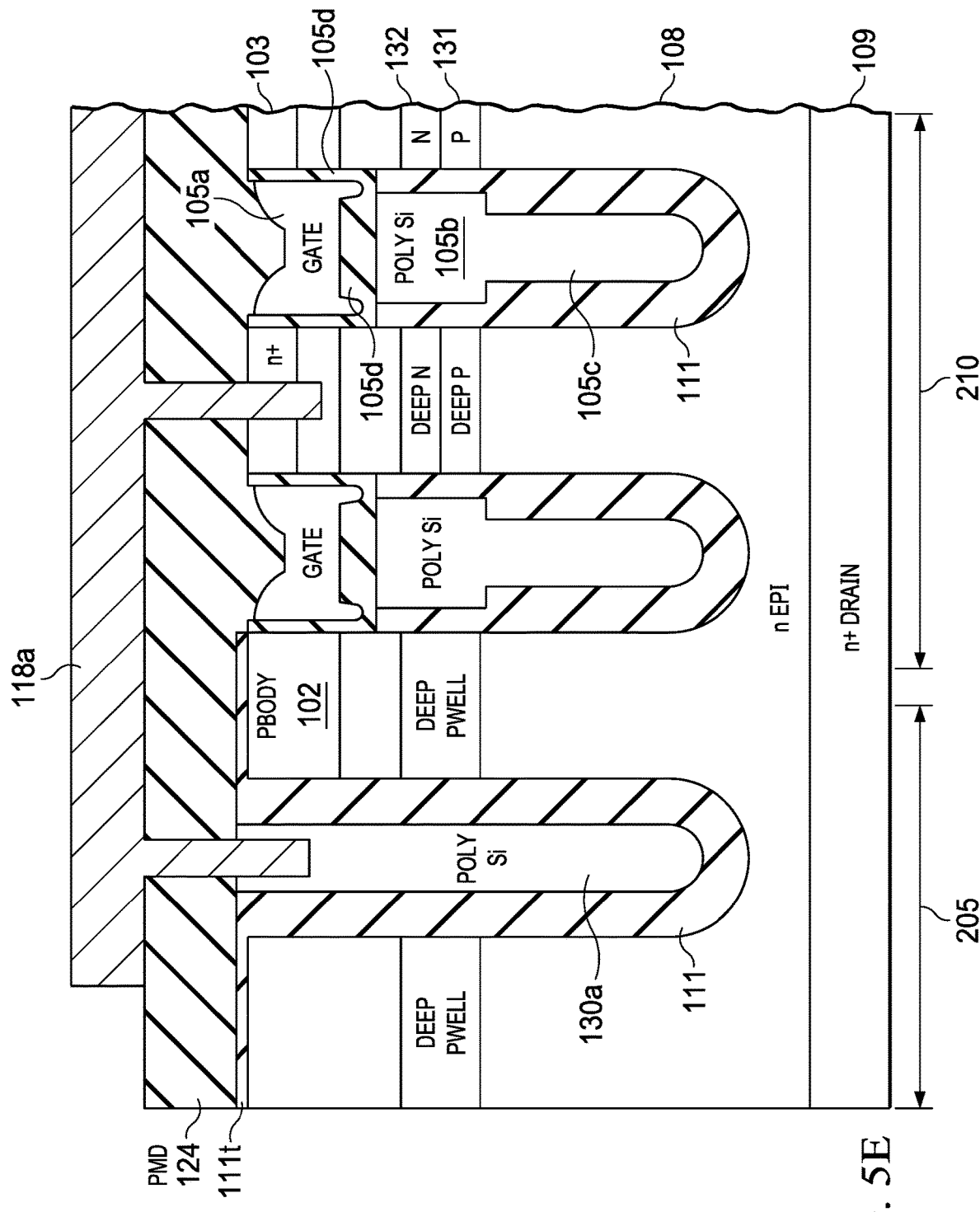

FIG. 5E shows the cross sectional view of the in-process trench gate MOSFET device after forming the PMD layer 124, contact aperture formation through the PMD layer 124 to reach the single shield field plate 130a, to reach the source region 103 and pbody region 102, and to reach the polysilicon gates 105a. Metal 1 formation follows to provide a metal contact 118a to tie the single shield field plate 130a to the source regions 103 and pbody regions 102, and another metal contact that is not shown in FIG. 4I which is described above as metal contact 118b contacts the respective polysilicon gates 105a. The junction termination trench 130 can be seen to have a single shield field plate 130a, and the active trench gates 105 to have a double shield field plate 105b, 105c.

Disclosed trench gate power MOSFETs can be used in a variety of applications such as electronic switches in the power management applications. Disclosed trench gate power MOSFETs can be configured as a disclosed trench gate power MOSFET die, or as an IC having one or more disclosed trench gate power MOSFETs with other integrated circuitry.

EXAMPLES

Disclosed aspects are further illustrated by the following specific Examples, which should not be construed as limiting the scope or content of this Disclosure in any way.

FIG. 6A shows example dopant profiles with the dopant concentration as a function of depth (in µms) below the surface of the n-epi layer 108, determined by simulation. A first profile shows a constant concentration for the n-epi layer of phosphorus of about $1 \times 10^{17}$ cm$^{-3}$ to a depth to about 5 μm. A second profile shows a concentration of boron implanted at 700 keV, which has a local maximum concentration of about $6 \times 10^{16}$ cm$^{-3}$ at a depth of about 1 μm. A third profile shows a concentration of boron implanted at 900 keV, which has a local maximum concentration of about $6 \times 10^{16}$ cm$^{-3}$ at a depth of about 1.2 μm. A counter-doped buried layer portion of the n-epi layer may be considered to begin at the local minimum preceding each local maximum, and end at the depth the concentration returns to the local minimum concentration. The boron concentration profiles are retrograde as the concentration increases from the local minimum to the local maximum. It is apparent from this simulated data that the depth and the extent (difference between maximum depth and minimum depth) of the counter-doped buried layer portion both may be expected to increase with greater implant energy. These profiles also show that under the example implant conditions, the concentration of p-type dopant (boron) does not exceed the concentration of n-type dopant (phosphorous), so the counter-doped buried layer portion of the n-epi layer remains n-type, though with a lower electron concentration as compared to the n-type doping concentration in the n-epi layer 108 outside the counter-doped buried layer. Those skilled in the pertinent art are able to determine implant conditions for an n-type dopant such as phosphorous to place the n-type dopant into the counter-doped buried layer to increase the carrier concentration if desired, as described in the example of FIG. 5D.

Figure 6B:
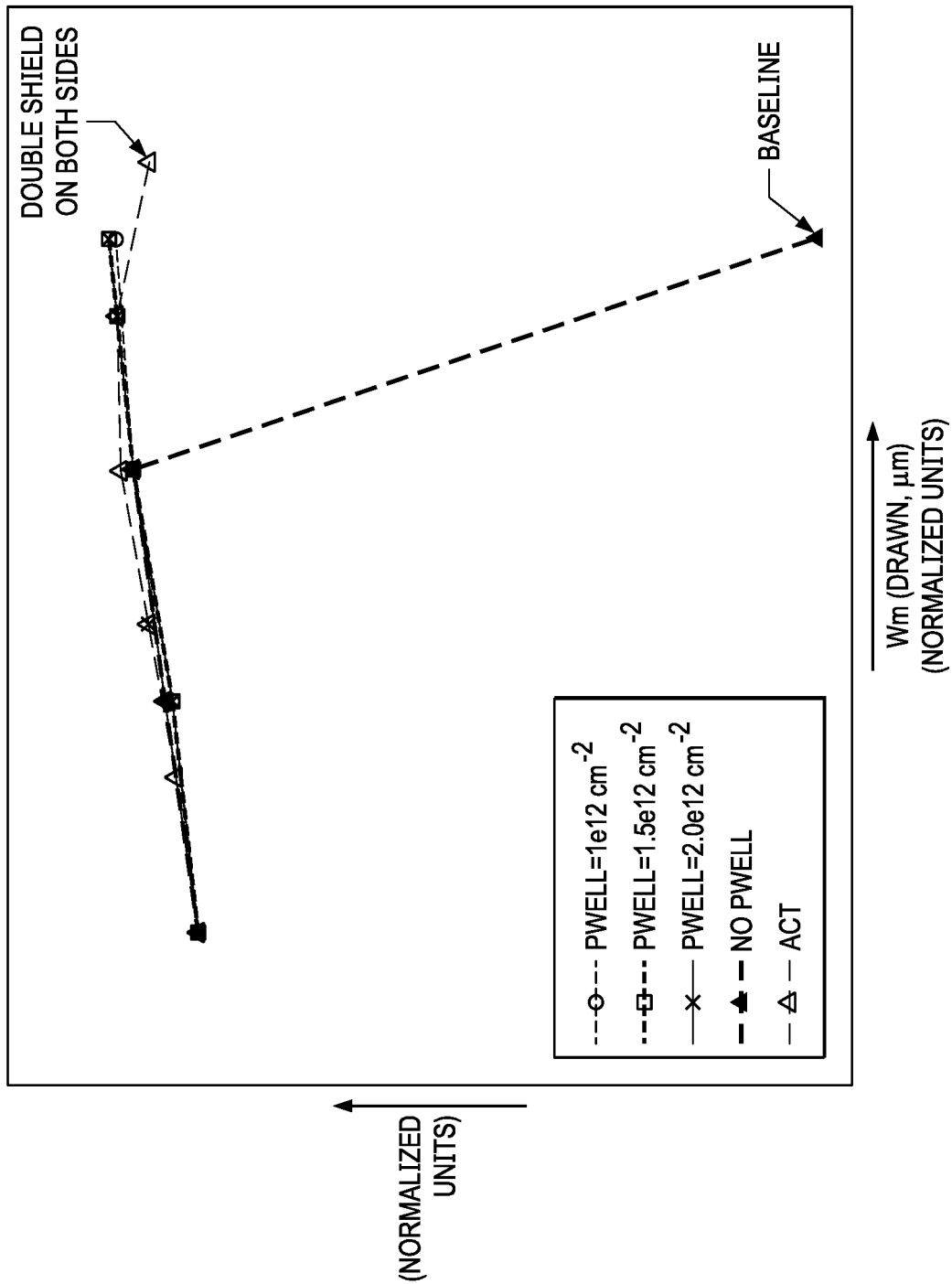
FIG. 6B shows the resulting trench gate n-channel MOSFET device breakdown voltage for an example implant energy at several implant doses as a function of drawn spacing between drawn the trenches (mesa width) as compared to a control MOSFET device without a disclosed deep pwell implant and another control with the termination trench having a double shield field plate.

FIG. 6B shows the resulting simulated trench gate n-channel MOSFET device BV corresponding to the example 700 keV dopant profile of FIG. 6A. Five characteristics are shown of BV as a function of drawn mesa width Wm, e.g. the width of the pbody region 102. Three characteristics correspond to the presence of the counter-doped buried layer portion of the n-epi layer only having the deep pwell region 131, with boron dose of $1 \times 10^{12}$ cm$^{-2}$, $1.5 \times 10^{12}$ cm$^{-2}$ and $2 \times 10^{12}$ cm$^{-2}$. A fourth characteristic shown as "ACT" corresponds to the breakdown voltage in the active area 210, which serves as a benchmark for the BV in the junction termination area 205. A fifth characteristic corresponds to the case of no disclosed counter-doped buried layer shown as "No PWELL". The four examples that include the counter-doped buried layer, with or without the nwell 132, closely agree, with generally increasing BV with increasing Wm. The example lacking the counter-doped buried layer closely follows the other examples up to a value of Wm at which the BV decreases by about 50%. These simulated data evidence the expected benefit of the presence of the deep pwell region 131 in the n-epi layer around the outer junction termination trench 130 as described in the various examples presented herein, e.g. a stable BV of the trench MOSFET device using the single shield outer junction termination trench 130, which may eliminate issues related to the aforementioned manufacturing alignment variation.

Figure 7:
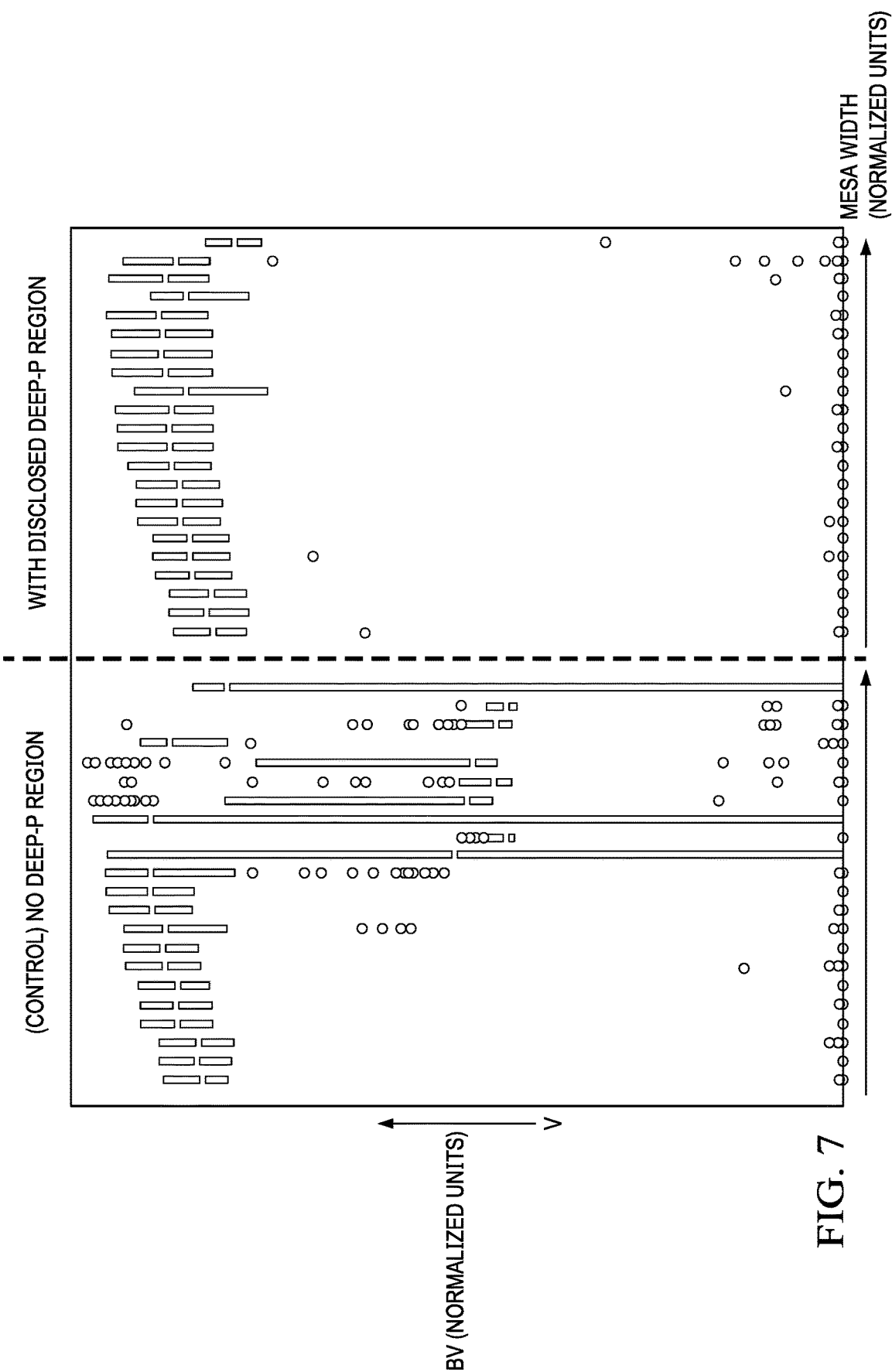
FIG. 7 shows measured results evidencing a BV improvement at a wider mesa width, comparing the BV from drain to source for a vertical trench gate N-MOSFET device with a single shield field plate without a disclosed deep p-type dopant implant in the junction termination area and a disclosed vertical trench gate N-MOSFET device with a single shield field plate with a disclosed deep p-type dopant implant in the junction termination area.

FIG. 7 show measured BV obtained from two manufactured lots, with and without the presence of the counter-doped buried layer. These results evidence a BV improvement at wider mesa width comparing the BV for a control vertical trench gate N-MOSFET device with a single shield field plate without a disclosed deep-pwell implant in the junction termination area, and a disclosed vertical trench gate N-MOSFET device with a single shield field plate with a deep-p implant in the junction termination area according to disclosed examples. As described above, the deep pwell implant compensates charge balance in junction termination region to avoid BV degradation caused by the termination trench having a single shield, where the single shield field plate structure simplifies the fabrication process as compared to a process for forming a double shield field plate structure for the termination trench.

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:

1. A method of fabricating a trench metal oxide semiconductor field effect transistor (MOSFET) device, comprising:
   forming a plurality of trenches in an epitaxial layer of a semiconductor substrate, the epitaxial layer having a first conductivity type and the trenches including active area trenches in an active area and an outer junction termination trench in a junction termination area, the active area trenches and the outer junction termination trench each including a corresponding field plate;
   forming body regions doped a second conductivity type between each adjacent pair of the active area trenches and between the junction termination trench and an adjacent active area trench;
   implanting a dopant of the second conductivity type into the epitaxial layer between the junction termination trench and the adjacent active area trench, thereby forming a buried layer having the second conductivity type with a portion of the epitaxial layer located between the buried layer and a surface of the semiconductor substrate;
   forming source regions of the first conductivity type within the body regions; and
   forming a conductive path that connects the field plate in the outer junction termination trench to the body regions and the source regions.

2. The method of claim 1, wherein a peak concentration of the dopant in the buried layer is at least 40% of a concentration of a dopant of the first conductivity type in the epitaxial layer.

3. The method of claim 1, wherein the implanting comprises blocking the implanting from the active area.

4. The method of claim 1, wherein the implanting comprises boron implanting with a dose in a range between about $8 \times 10^{11}$ cm$^{-2}$ and about $5 \times 10^{12}$ cm$^{-2}$ at an energy in a range between about 400 keV and about 1 MeV.

5. The method of claim 1, wherein the implanting comprises boron implanting with a dose of about $2 \times 10^{12}$ cm$^{-2}$ at an energy of about 700 keV.

6. The method of claim 1, wherein the implanting includes a blanket implant that also implants the dopant of the second conductivity type in the active area, further comprising implanting a dopant of the first conductivity type in the active area with a retrograde dopant profile at a same mask level as the forming of the source regions.

7. The method of claim 6, wherein implanting the dopant of the second conductivity type comprises boron implanting with a dose in range between about $8 \times 10^{11}$ cm$^{-2}$ and about $5 \times 10^{12}$ cm$^{-2}$ at an energy in a range between about 400 keV and about 1 MeV, and wherein implanting the dopant of the first conductivity type comprises implanting phosphorus with a dose in a range between about $1 \times 10^{12}$ cm$^{-2}$ and about $1 \times 10^{13}$ cm$^{-2}$ at an energy in a range between about 500 keV and about 3 MeV.

8. The method of claim 1, wherein the first conductivity type comprises n-type.

9. The method of claim 1, wherein the buried layer is exclusively in the junction termination area.

10. The method of claim 1, further comprising forming a pre-metal dielectric (PMD) layer over the substrate, and forming contacts through the PMD layer to the source regions, forming the contacts including etching through the source regions to reach the body regions.

11. The method of claim 1, further comprising forming a layer of the second conductivity type between the junction termination trench and the adjacent active area trench, the layer of the second conductivity type extending from the surface of the semiconductor substrate to the portion of the epitaxial layer.

12. A trench metal oxide semiconductor field effect transistor (MOSFET) device, comprising:
a substrate including an epitaxial layer of the first conductivity type;
a plurality of active area trenches in an active area that each include a polysilicon field plate;
an outer junction termination trench that includes an outer polysilicon field plate, wherein the epitaxial layer between the outer junction termination trench and an adjacent active area trench includes a first buried layer having a second conductivity type and having the first conductivity type between the buried layer and a surface of the substrate;
body regions of the second conductivity type, each located between adjacent ones of the plurality of the active area trenches, and between the outer junction termination trench and the adjacent active area trench;
source regions of the first conductivity type, each located within a corresponding body region; and
a conductive path that connects the outer polysilicon field plate to the body regions and to the source regions.

13. The trench MOSFET device of claim 12, wherein a peak dopant concentration in the first buried layer is at least 40% of a dopant concentration in the epitaxial layer.

14. The trench MOSFET device of claim 12, wherein a dopant of the first buried layer is excluded from the active area.

15. The trench MOSFET device of claim 12, wherein the epitaxial layer between the active area trenches includes a second buried layer having the first conductivity type.

16. The trench MOSFET device of claim 12, wherein the first conductivity type is n-type.

17. The trench MOSFET device of claim 12, wherein the conductive path includes contacts that extend through the source regions to the body regions.

18. The trench MOSFET device of claim 12, wherein a depth of the active area trenches and the outer junction termination trench is in a range between about 1 µm and about 10 µm.

19. The trench MOSFET device of claim 12, wherein the field plate within the outer junction termination trench is a single shield field plate, and the field plates within the active area trenches are double shield field plates.

20. The device of claim 12, further comprising a semiconductor portion of the first conductivity type located between the buried layer and a surface of the substrate, and between the outer junction termination trench and the adjacent active area trench.

21. A method of forming an integrated circuit, comprising:
forming a plurality of field plates within a lightly-doped epitaxial layer over a semiconductor substrate, the lightly-doped epitaxial layer having a first conductivity type;
forming a junction termination plate adjacent to a first field plate of the plurality of field plates, and
implanting a dopant of a second different conductivity type into the epitaxial layer between the junction termination plate and the first field plate such that the dopant has a peak concentration in a counter-doped buried layer below a top surface of the epitaxial layer, and a semiconductor portion is located between the peak concentration and the top surface and between the junction termination plate and the first field plate.

22. The method of claim 21, wherein the dopant is a first dopant, and the counter-doped buried layer is a first counter-doped buried layer, further comprising:
implanting the first dopant into a second counter-doped buried layer between the first field plate and a second field plate, and implanting a second dopant of the first conductivity type into the second counter-doped buried layer.

23. The method of claim 21, wherein the field plates are double shield field plates and the junction termination plate is a single shield field plate.

24. The method of claim 21, wherein the dopant is implanted with a dose of about $2\times10^{12}$ cm$^{-2}$ and an energy of about 700 keV.

25. The method of claim 21, wherein the dopant is implanted with a dose in a range between about $8\times10^{11}$ cm$^{-2}$ and $2\times10^{12}$ cm$^{-2}$, and an energy in a range between about 400 keV and about 1 MeV.

26. The method of claim 21, further comprising:
forming a second field plate;
forming respective first and second gate electrodes over the first and second field plates;
forming a first body region between the junction termination plate and the first field plate;
forming a second body region between the first and second field plates;
forming a source region between the second body region and the substrate surface; and
connecting the second body region to the junction termination plate by a conductive path.

27. The method of claim 21, wherein implanting the dopant comprises performing a blanket implant of the dopant, and further comprising using a same mask pattern to form the source region and to implant a second dopant of the first conductivity type into the counter-doped buried layer.

28. The method of claim 21, further comprising forming a layer of the second conductivity type between the junction termination plate and the first field plate, the layer of the second conductivity type extending from a surface plane coincident with a top surface of the junction termination plate to the semiconductor portion.

29. An integrated circuit, comprising:
a plurality of field plates within an epitaxial layer having a first conductivity type and located over a semiconductor substrate;
a junction termination plate adjacent a first field plate of the plurality of field plates;
a counter-doped buried layer including a dopant of a second different conductivity type located between the junction termination plate and the first field plate, the counter-doped buried layer having the second conductivity type; and a semiconductor portion having the first conductivity type and located between the counter-doped buried layer and a surface plane coincident with a top surface of the junction termination plate and between the junction termination plate and the first field plate.

30. The integrated circuit of claim 29, wherein the dopant is a first dopant, and the counter-doped buried layer is a first counter-doped buried layer, and further comprising:
a second counter-doped buried layer located between adjacent ones of the field plates, the second counter-doped buried layer including a dopant of the different conductivity type having a peak concentration below the surface plane.

31. The integrated circuit of claim 29, wherein the field plates are double shield field plates and the junction termination plate is a single shield field plate.

32. The integrated circuit of claim 29, wherein the dopant has a peak concentration less than a dopant concentration in the epitaxial layer.

* * * * *